United States Patent
Kondo

(10) Patent No.: US 11,798,611 B2
(45) Date of Patent: Oct. 24, 2023

(54) MEMORY ACCESS CONTROLLER WITH REFRESHER AND SCRUBBING MECHANISM AND MEMORY ACCESS CONTROL METHOD THEREOF

(71) Applicant: FUJITSU LIMITED, Kawasaki (JP)

(72) Inventor: Yuji Kondo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/853,972

(22) Filed: Jun. 30, 2022

(65) Prior Publication Data

US 2023/0136432 A1 May 4, 2023

(30) Foreign Application Priority Data

Nov. 4, 2021 (JP) ................. 2021-180595

(51) Int. Cl.
*G11C 11/406* (2006.01)
*G11C 7/10* (2006.01)

(52) U.S. Cl.
CPC ........ *G11C 11/40615* (2013.01); *G11C 7/109* (2013.01); *G11C 7/1063* (2013.01); *G11C 11/40618* (2013.01)

(58) Field of Classification Search
CPC ........ G11C 11/40615; G11C 11/40618; G11C 7/1063; G11C 7/109
See application file for complete search history.

(56) References Cited

U.S. PATENT DOCUMENTS 5,511,078 A * 4/1996 Barucchi ............. H03M 13/151
714/763

FOREIGN PATENT DOCUMENTS

JP 2006-107614 A 4/2006
JP 2006-260472 A 9/2006

OTHER PUBLICATIONS

Optimized Runtime Scrubbing and Sparing Control (Year: 1994).*

* cited by examiner

*Primary Examiner* — Sultana Begum
(74) *Attorney, Agent, or Firm* — Fujitsu Patent Center

(57) ABSTRACT

A memory access controller includes a request issuing circuit to issue a user request in response to a memory request, issue a refresh request at first issuing intervals, and issue a scrubbing request at second issuing intervals; and a command issuing circuit to issue a first active to a memory via a row command bus and issue M reads to the memory via a column command bus after the first active is issued, when memory access for the user request is to be executed, issue refresh to the memory via the row command bus when the memory access for the refresh request is executed, and issue a second active to the memory via the row command bus and issues N (>M) reads to the memory via the column command bus after the second active is issued, when the memory access for the scrubbing request is to be executed.

5 Claims, 22 Drawing Sheets

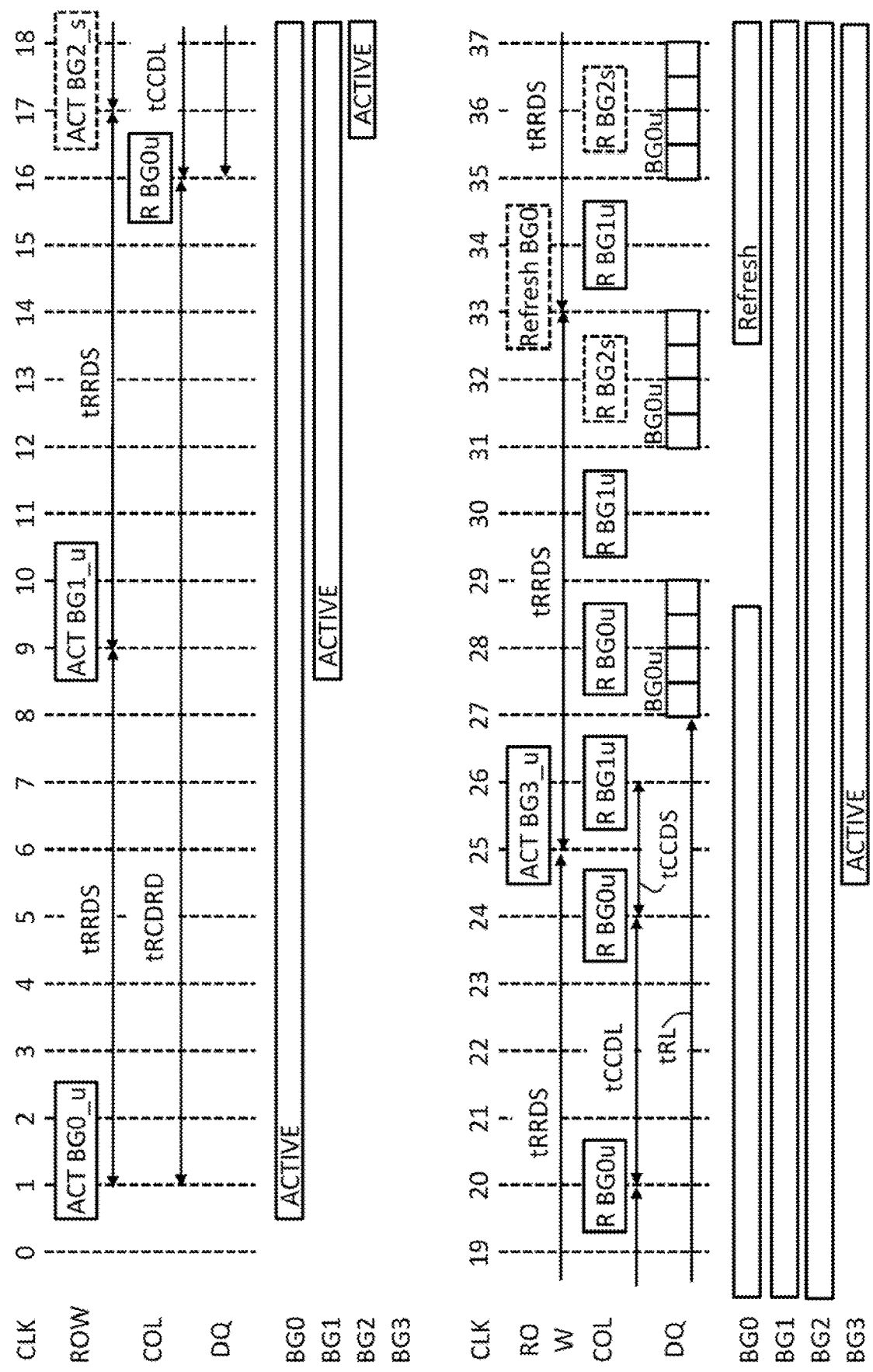

FIG. 2B
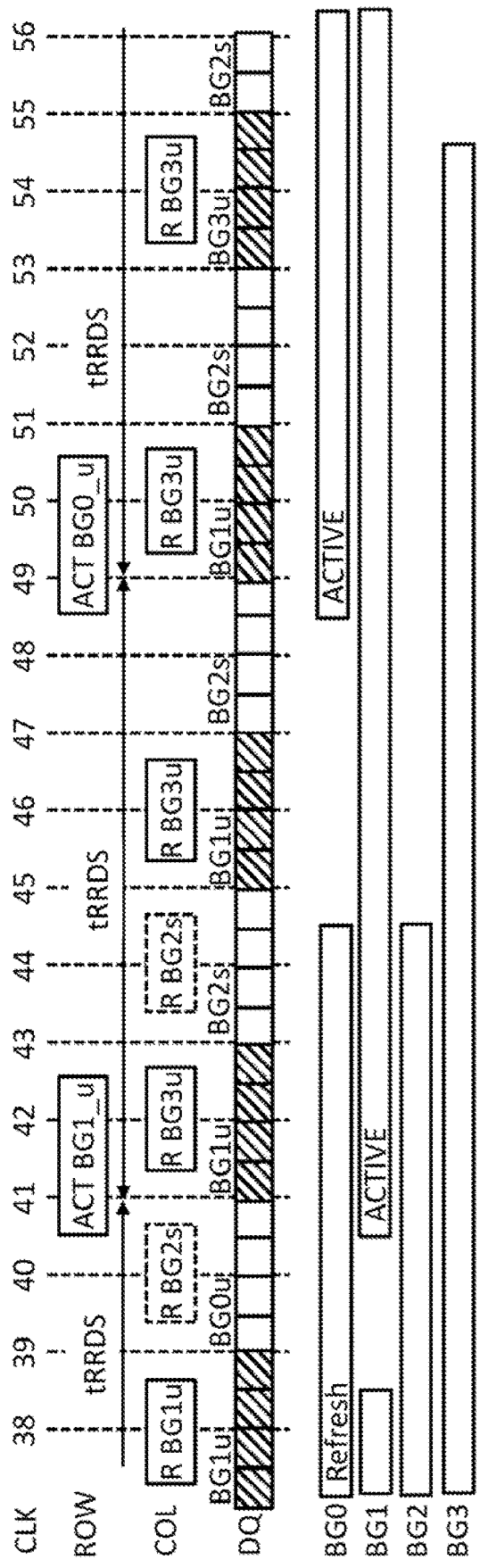
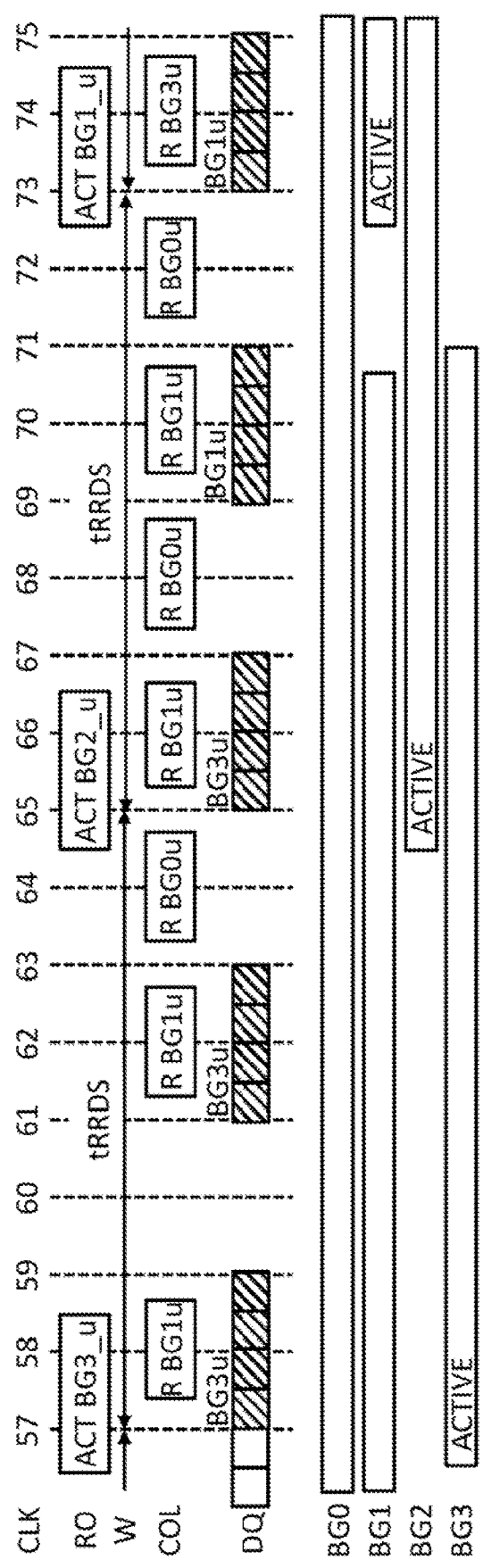

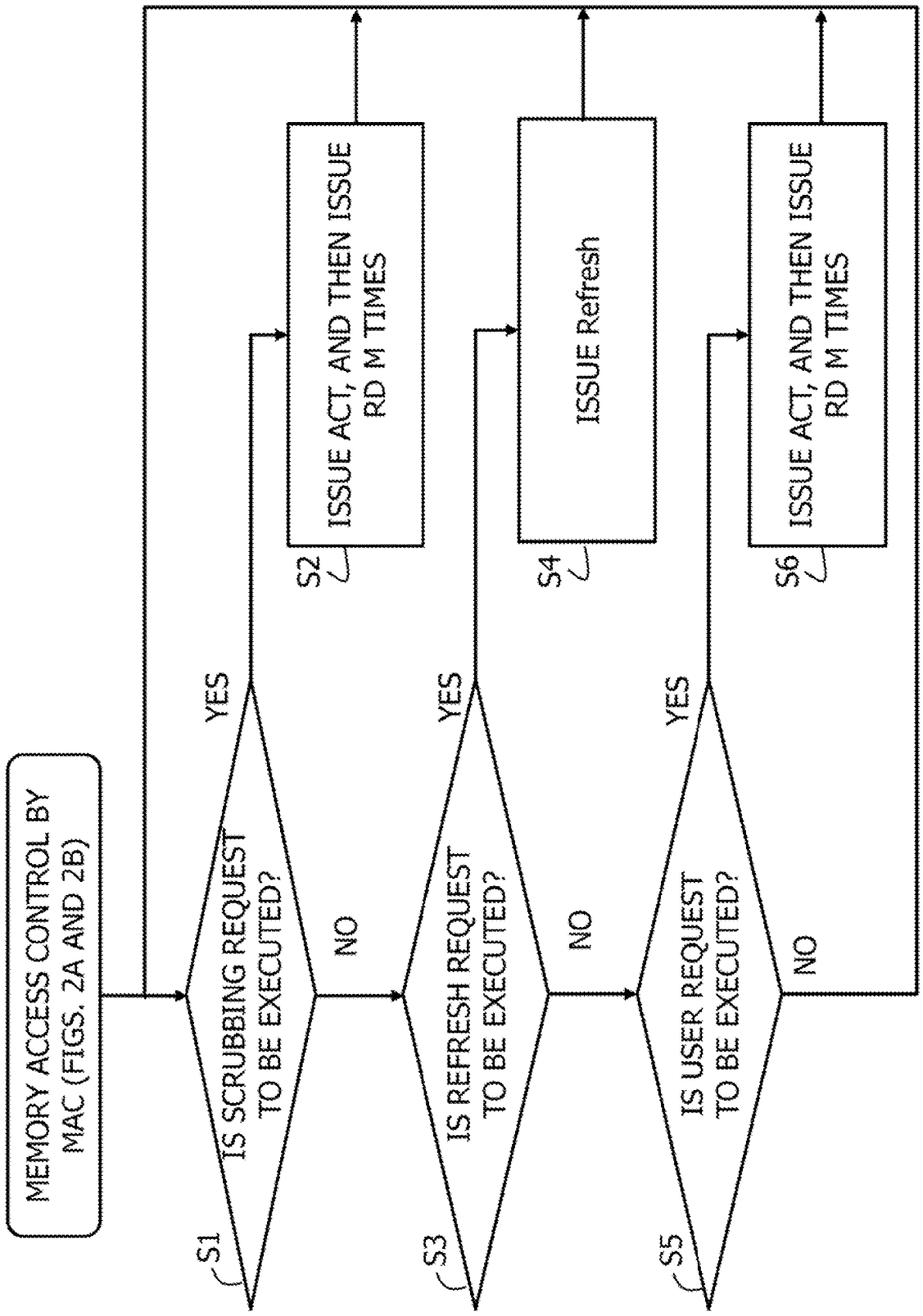

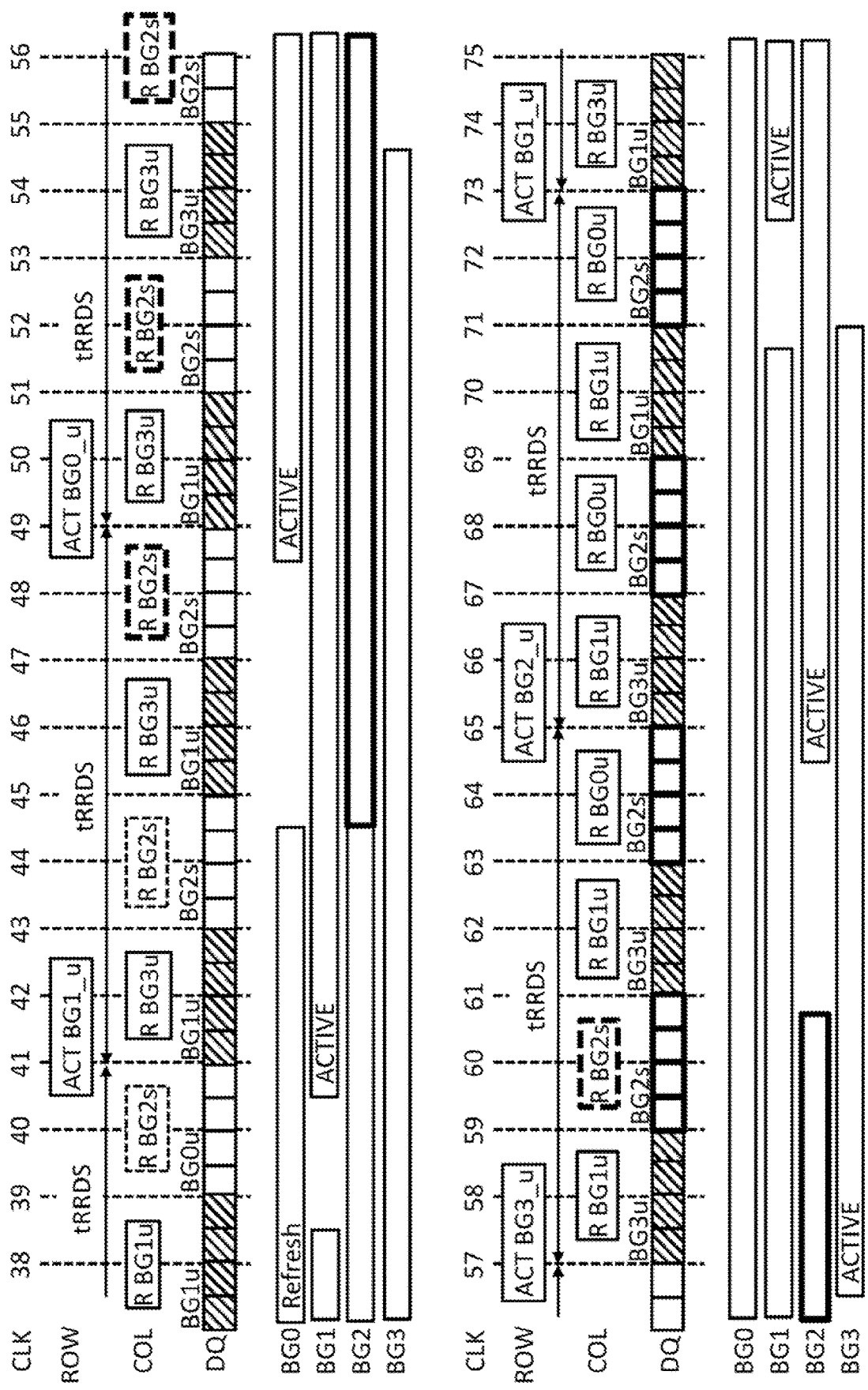

MEMORY ACCESS CONTROLLER WITH REFRESHER AND SCRUBBING MECHANISM AND MEMORY ACCESS CONTROL METHOD THEREOF

CROSS-REFERENCE TO RELATED APPLICATION

This application is based upon and claims the benefit of priority of the prior Japanese Patent Application No. 2021-180595, filed on Nov. 4, 2021, the entire contents of which are incorporated herein by reference.

FIELD

The present invention relates to a memory access controller and a memory access control method.

BACKGROUND

A memory access controller (hereinafter referred to as a "MAC") issues a command corresponding to the specifications of a memory in response to a memory request issued from a processor core or a cache circuit, to control the memory request. The memory request is a memory access request made by an application program, for instance, and mainly includes a read request, a write request, etc. Such a memory request issued from a processor core or a cache circuit will hereinafter be referred to as a "user memory request" or a "user request".

Besides the user request, the MAC issues a memory request in order to maintain data stored in a memory. Such a memory request is made for reasons of the structure of a dynamic random access memory (DRAM), and includes a refresh request and a scrubbing request, for instance.

Refresh is a process of reading and rewriting stored data before the charge state of a cell capacitor of the DRAM is lost, in order to prevent a loss of the charge state. Scrubbing is a process of detecting stored data that have been subjected to bit inversion caused by irradiation of a memory chip with cosmic rays, e.g., a rays etc., to correct an error in the data. Refresh needs to be executed within a first predetermined time for all the cells of the memory. Likewise, scrubbing needs to be executed within a second predetermined time for all the cells of the memory.

The MAC issues, to the memory, a row command via a row command bus and a column command via a column command bus. The MAC also receives input of (reads) data from and outputs (writes) data to the memory via a data bus.

For refresh, the MAC issues active, which is a row command, drives word lines of the memory, and amplifies the charge state of the cells to refresh the charge state of the cells. For refresh, the MAC does not need to issue a column command. For scrubbing, the MAC issues active, which is a row command, and further issues read, which is a column command, to read data in the cells. Then, the MAC detects an error in the read data, and writes error-corrected data into the cells. For this writing, the MAC issues active, and further issues write which is a column command.

Japanese Patent Application Publication No. 2006-260472 and Japanese Patent Application Publication No. 2006-107614 disclose memory access control by the MAC.

SUMMARY

For a user request, the MAC issues active via the row command bus, drives word lines of the memory, and issues read via the column command bus a number of times corresponding to the access length to read data from the memory. The MAC controls memory access for a user request with a fixed access length in consideration of a reduction in throughput during sequential access. For instance, when memory access for a user request is made with an access length of 4, the MAC issues read four times for one active. For instance, the MAC which is hardware executes memory access for a user request with a fixed access length in accordance with the access length for software. Alternatively, the MAC executes memory access for two user requests, for instance.

By making memory access for a user request with a fixed access length, the constraint on the timing to issue a command to the memory is able to be simplified, and complication of the memory access control by the MAC is able to be avoided.

For a scrubbing request, on the other hand, the MAC voluntarily reads data from the memory, irrespective of a user request from a last level cache (LLC). However, reading based on a scrubbing request and reading based on a user request are, to the memory, the same reading request. Therefore, the MAC executes memory access with the fixed access length described above also for reading based on a scrubbing request.

In computation for deep learning in recent years, for instance, memory access with single granularity as in low-precision computation, e.g., single-precision or half-precision computation, for instance, has been increasing. The increasing memory access is mainly reading. As the frequency of memory access is increased, the frequency of issuing active on the basis of a user request is increased.

Along with an increase in the capacity of the memory, on the other hand, the number of times of refresh and the number of times of scrubbing per unit time are increased. The increase in the number of times or the frequency of refresh or scrubbing also incurs an increase in the frequency of issuing active.

As a result, the increase in the frequency of issuing active on the basis of a user request creates a bottleneck in the row command bus, and incurs a reduction in the throughput of memory access based on the user request. When the memory capacity is increased, further, the frequency of issuing active on the basis of a refresh request or a scrubbing request is accordingly increased, which incurs a bottleneck in the row command bus. As a result, active based on the user request is inhibited by the issuance of active for refresh or scrubbing, which causes a constraint that active based on the user request is not able to be issued. This is because refresh and scrubbing are processes that are needed to save data in the memory and the issuance of active for refresh and scrubbing is not able to be decreased. In this case, a reduction in the throughput for the user request is incurred.

One aspect of the embodiment is a memory access controller including: a request issuing circuit configured to issue a user request in response to a memory request that is input, issue a refresh request at first issuing intervals, and issue a scrubbing request at second issuing intervals; and a command issuing circuit configured to issue a first active to a memory via a row command bus and issue M reads to the memory via a column command bus after the first active is issued, when memory access for the user request is to be executed, issue refresh to the memory via the row command bus when the memory access for the refresh request is executed, and issue a second active to the memory via the row command bus and issues N reads to the memory via the column command bus after the second active is issued, when the memory access for the scrubbing request is to be executed, with the N being greater than the M.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A and 2B illustrate a timing chart of an example of memory access control.

FIG. 3 illustrates a schematic flowchart of the memory access control by the MAC illustrated in FIGS. 2A and 2B.

FIGS. 4A and 4B illustrate a timing chart of an example of memory access control according to the first embodiment.

DESCRIPTION OF EMBODIMENTS

Figure 1:
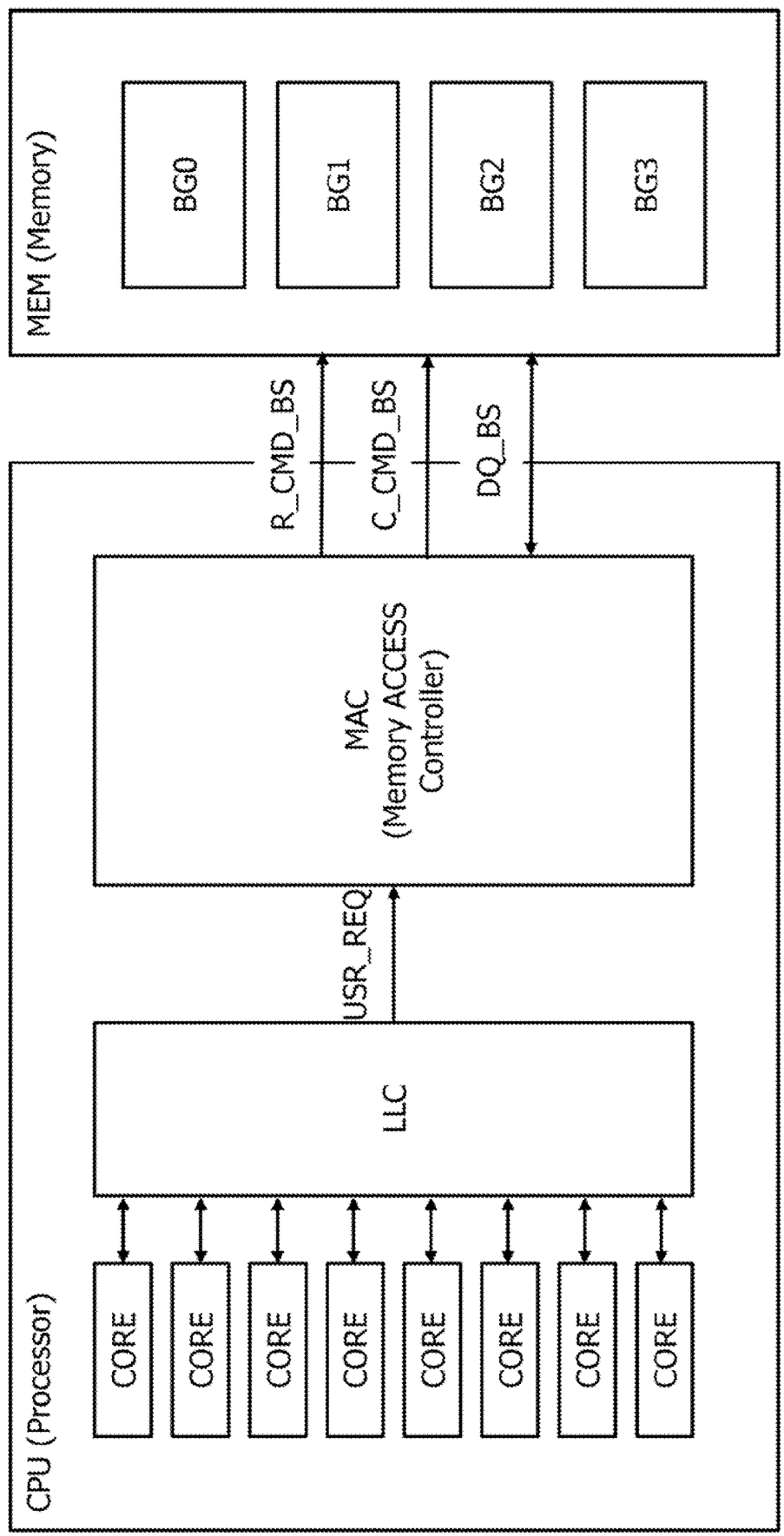
FIG. 1 illustrates an example of the configuration of a processor CPU that includes a memory access controller MAC according to the present embodiment.

FIG. 1 illustrates an example of the configuration of a processor CPU that includes a memory access controller MAC according to the present embodiment. The processor CPU is a central processing unit, for instance. The processor CPU includes a plurality of, e.g. eight, processor cores CORE (hereinafter simply referred to as "cores"). The cores CORE each include an instruction decoder, a computation unit that executes a decoded instruction, a level-1 (L1) cache unit, etc., and issues a memory request that requests memory access along with execution of a program.

The processor further includes a last-level cache unit LLC to be shared by the L1 caches of the plurality of cores, and an MAC that controls a memory request for a memory MEM, for instance. In FIG. 1, the MAC is provided in a chip of the processor CPU. However, the MAC may be provided outside the chip of the processor CPU.

The LLC issues a memory request to the MAC when a cache error is detected for a memory request issued from a processor core. The memory request issued by the LLC to the MAC is referred to as a "user request USR_REQ" for differentiation from memory requests, e.g., a scrubbing request and a refresh request issued by the MAC itself.

The MAC issues a row command R_CMD via a row command bus R_CMD_BS and a column command C_CDM via a column command bus C_CMD_BS for control of a memory request for the memory MEM. Further, the MAC is connected to the memory MEM through a data bus DQ_BS, and receives data from the memory MEM for read and transmits data to the memory MEM for write via the data bus DQ_BS.

FIG. 1 illustrates a schematic configuration of the memory MEM. The memory includes a plurality of, e.g., four, bank groups BG. The bank group address for specifying each bank group has two bits, BG [1:0]. Although not illustrated in FIG. 1, each bank group BG includes a plurality of, e.g. eight, banks. The bank address for specifying each bank has three bits, BA [2:0]. A plurality of word lines and a plurality of bit lines are provided in each bank. Cells that store data are disposed at positions at which the word lines and the bit lines intersect each other. Each cell is specified by a row address RA that specifies a word line and a column address CA that specifies a bit line. The address that specifies the minimum unit of access is referred to as "adrs". Herein, ba [4:0] is the address for specifying the banks, and ba [4:0]=BG [1:0], BA [2:0] is met.

In the present embodiment, as a precondition, a closed page memory access control method is used for control of memory access to the memory MEM by the MAC. In the closed page memory access control method, active which is a row command is issued to drive the word line, read or write which is a column command is issued to read or write data, and finally precharge is issued to finish drive of the word line. After that, new active is applied to the memory to perform the next memory access. Thus, one memory request is started with active and finished with precharge.

Example in Which User Request in Memory Access Control Is Inhibited by Refresh Request and Scrubbing Request FIGS. 2A and 2B illustrate a timing chart of an example of memory access control. An example in which a user request in memory access control is inhibited by a refresh request and a scrubbing request will be described on the basis of the example of memory access control. In the drawings, clock numbers 1, 2 to 75 are indicated in the row of clock CLK. That is, FIGS. 2A and 2B illustrate a continuous timing chart with a total of four stages with FIGS. 2A and 2B each divided into two, upper and lower, stages.

FIG. 3 illustrates a schematic flowchart of the memory access control by the MAC illustrated in FIGS. 2A and 2B. When a scrubbing request is to be executed (YES in S1), the MAC issues active ACT to the memory via the row command bus, and thereafter issues read RD M times to the memory via the column command bus (S2). The number M is four, for instance. When a refresh request is to be executed (YES in S3), further, the MAC issues refresh Refresh to the memory via the row command bus (S4). Read etc. are not issued to the column command bus. When a user request is to be executed (YES in S5), the MAC issues active ACT to the memory via the row command bus, and thereafter issues read RD M times to the memory via the column command bus (S6). The number M is four, as for scrubbing. The scrubbing request and the user request are, to the memory, the same access control for read. Therefore, the hardware circuit of the MAC performs common circuit operation in which the access length (number of times of read) is M for both the scrubbing request and the user request.

Next, the memory access control illustrated in the timing chart in FIGS. 2A and 2B will be described in the order of the user request, the scrubbing request, and the refresh request.

User Request

First, active, read, and a DQ terminal as a data terminal for a user request will be described. At clocks CLK 1 and CLK 2, the MAC issues first active ACT BG0_u for the user request. This active is for a bank group BG0. A bank group ID (GB0) and a user request u have been added to the symbol ACT for active. Then, at clocks CLK 9 and CLK 10 after a command issuance constraint tRRDS from the issuance of the first active ACT BG0_u (CLK 1), the MAC issues second active ACT BG1_u for the memory request (CLK 9). The command issuance constraint tRRDS means "RAS to RAS Delay among different memory bank groups". In this example, the command issuance constraint tRRDS is 8 clocks.

At clock CLK 16 after a command issuance constraint tRCDRD from the issuance of the first active ACT BG0_u (CLK 1), the MAC issues first read R BG0u (CLK 16). The command issuance constraint tRCDRD means "RAS to CAS Delay for Read" and is 15 clocks. Further, second read R BG0_u (CLK 20) is issued at clock CLK 20 after a command issuance constraint tCCDL (=4) from the issuance of the first read R BG0u (CLK 16), and further third and fourth reads RBG0_u (CLK 24) and R BG0_u (CLK 28) are issued at clocks CLK 24 and CLK 28, respectively, after tCCDL (=4) thereafter. The user request has an access length of 4 as described above, and the MAC issues one active ACT and four subsequent sequential reads R as a row command ROW and column commands COL, respectively.

At clocks CLK 27 and CLK 28 after a latency tRL (=11) from the issuance of the first read R BG0_u (CLK 16), four sets of data are output from the data terminal DQ. That is, as is known for the double data rate of DDR SDRAMs (double data rate Synchronous DRAMs), data are output from the data terminal DQ at the rising edge and the falling edge of the clock. At each of clocks CLK 31, CLK 35, and CLK 39 which are tRL (=11) after CLK 20, CLK 24, and CLK 28 at which the second, third, and fourth reads are issued, four sets of data are output from the data terminal DQ. The memory access control based on active ACT BG0_u (CLK 1) for the first user request is finished as described above.

In the drawings, the active states of the four bank groups BG0 to BG3 are indicated with ACTIVE. For the bank group BG0, the active state lasts from active ACT BG0_u (CLK 1) of the row command to read R BG0u (CLK 28) of the last column command. Precharge PRE (not illustrated) is added to the fourth read R BG0u (CLK 28), and the memory is returned to the state before active.

After the issuance of active ACT BG1_u (CLK 9) for the memory request for the second bank group BG1, the MAC issues four reads R BG1u, starting at CLK 26 after the command issuance constraint tRCDRD+2 (=15+2=17) therefrom and at intervals (CLK 30, CLK 34, CLK 38) of the command issuance constraint tCCDL (=4). Then, data are output to the data terminal DQ at CLK 37, CLK 41, CLK 45, and CLK 47 after tRL=11 from each read.

For active ACT BG1_u (CLK 9) for the second memory request, read R BG1u (CLK 26) is issued at CLK 26 after the command issuance constraint tRCDRD+tCCDS(=15+2=17) therefrom so that the read does not collide with the third read R BG0u (CLK 24) for active ACT_BG0_u (CLK 1) for the first memory request. tCCDS=2 means the CAS-to-CAS delay among different bank groups. This respect is different from active ACT BG0_u (CLK 1) for the first memory request. Consequently, the third and fourth reads R BG0u (CLK 24, CLK 28) for active ACT BG0_u (CLK 1) for the first memory request and the first and second reads RBG1u (CLK 26, CLK 30) for active ACT BG1_u (CLK 9) for the second memory request are issued alternately at intervals of tCCDS=2. At the DQ terminal, likewise, the third and fourth data sets (CLK 35, CLK 39) for active ACT BG0_u (CLK 1) for the first memory request and the first and second data sets (CLK 37, CLK 41) for active ACT BG1_u (CLK 9) for the second memory request are output alternately at intervals of tCCDS=2.

Active ACT BG3_u (CLK 25) for the third memory request is an even-numbered active that comes after active ACT BG2_s (CLK 17) for scrubbing. Thus, as with active ACT BG1_u (CLK 9) for the second memory request, the MAC issues four reads R BG3u, starting at CLK 42 after the command issuance constraint tRCDRD+tCCDS(=17) from active ACT BG3_u (CLK 25) and at intervals of tCCDL=4 (CLK 46, CLK 50, CLK 54). Further, data are output to the data terminal DQ at CLK 53, CLK 57, CLK 61, and CLK 65 after tRL=11 from each read.

Active ACT BG1_u (CLK 41) for the fourth memory request is an odd-numbered active that comes after refresh Refresh (CLK 33). Active ACTBG0_u (CLK 49) for the fifth memory request is an even-numbered active. The issuance of read commands and data at the DQ terminal are the same as discussed earlier.

Scrubbing Request

In the example in FIGS. 2A and 2B, active ACT BG2_s (CLK 17) for a scrubbing request is issued at clock CLK 17. This active is controlled as an odd-numbered active. Thus, as with active ACT BG0_u (CLK 1) for the first memory request, the MAC issues four reads R BG2s (CLK 32, CLK 36, CLK 40, CLK 44), starting at CLK 32 after the command issuance constraint tRCDRD (=15) from active ACT BG2_s (CLK 17) and at intervals of tCCDL=4. Further, data are output to the data terminal DQ at CLK 43, CLK 47, CLK 51, and CLK 55 after tRL=11 from each read.

For a scrubbing request, as for a user request for read, the MAC issues one active and four reads, and reads data from the memory. Then, the MAC checks an error in the read data, and executes a user request for write to the memory for correcting an error when the error is detected. However, row commands and column commands for a user request for write are not illustrated in FIGS. 2A and 2B.

It is assumed that a row command for any of active for a user request, active for a scrubbing request, and refresh for a refresh request can be issued at clock CLK 17. In the example in FIGS. 2A and 2B, however, active for a scrubbing request, for which the timing of issue has arrived, is issued. Therefore, the issuance of active for a user request that can be issued is inhibited by the scrubbing. The state in which active for a user request can be issued is a state in which a row command issuance constraint is met and there is no conflict with other memory requests for a column command or the DQ terminal.

Refresh Request

At clock CLK 33, refresh Refresh BG0 (CLK 33) is issued. For refresh, as for the issuance of an active command, the word line in the memory is driven, the charge state of the memory cells is read to the bit lines, the potential of the bit lines is amplified by sense amplifiers, the charge states of the memory cells are refreshed to the state at the time of writing, and drive of the word lines is finished so that data are rewritten. Thus, the MAC does not issue read as for a user request, and does not read data from the memory. Hence, the MAC does not issue a command to the column command bus COL at CLK 48, CLK 52, CLK 56, and CLK 60, starting after the command issuance constraint tRCDRD (=15) from Refresh BG0 (CLK 33) and at intervals of tCCDL=4. Likewise, data are not output to the data terminal DQ at CLK 59, CLK 63, CLK 67, and CLK 71 after the latency tRL=11 from CLK 48, CLK 52, CLK 56, and CLK 60, respectively.

It is assumed that a row command for any of active for a user request, active for a scrubbing request, and refresh for a refresh request can be issued at clock CLK 33. In the example in FIGS. 2A and 2B, refresh Refresh BG0 (CLK 33), for which the timing of issue has arrived, is issued. Therefore, the issuance of active for a user request that can be issued is inhibited by the refresh.

Figure 4A:
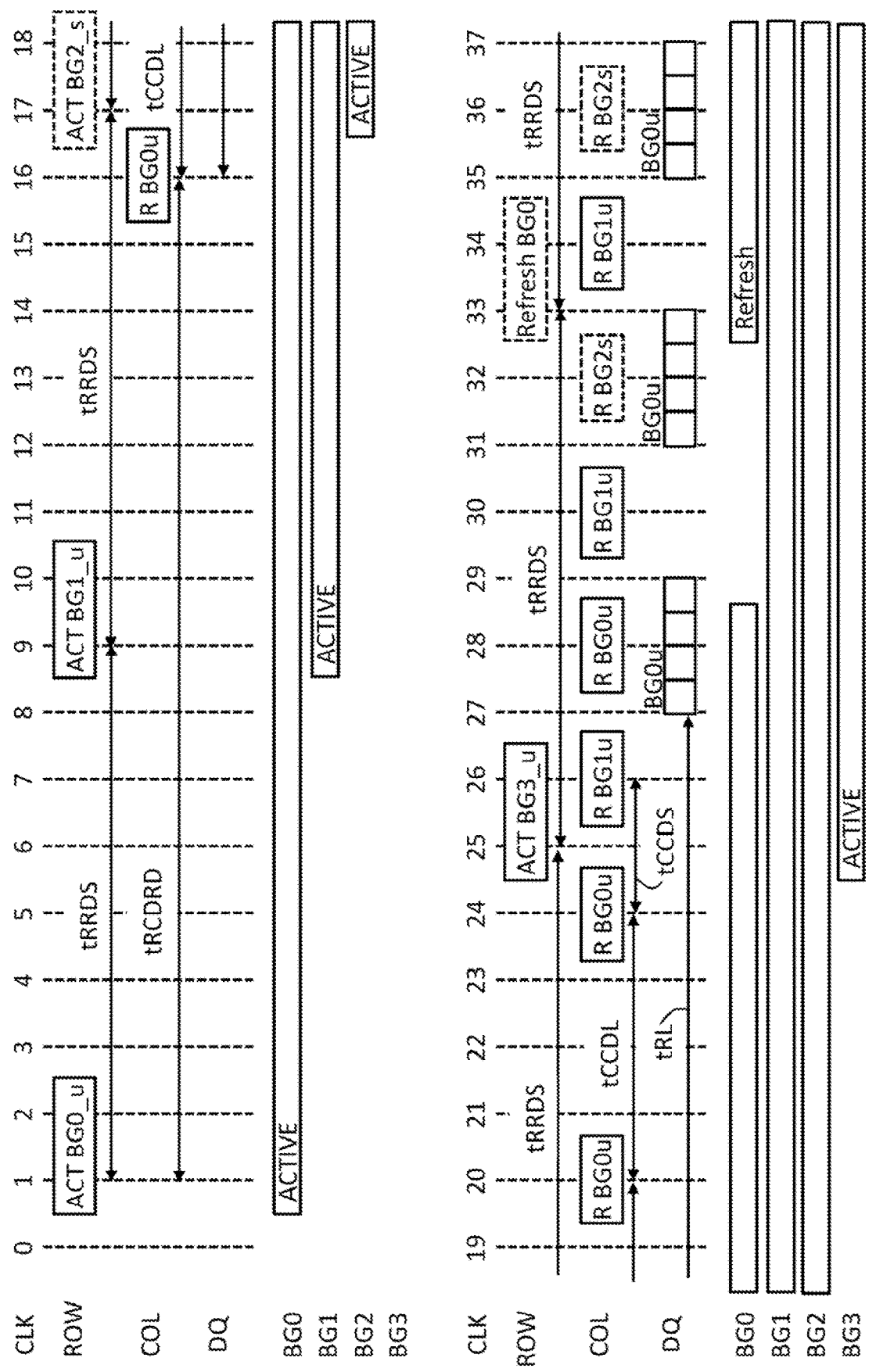

Example of Memory Access Control According to First Embodiment; Example in Which Throughput for User Request Is Improved by Concealing Reduction in Performance for User Request Due to Refresh FIGS. 4A and 4B illustrate a timing chart of an example of memory access control according to the first embodiment. In the example of the memory access control, a reduction in the performance for a user request due to refresh is concealed.

Figure 5:
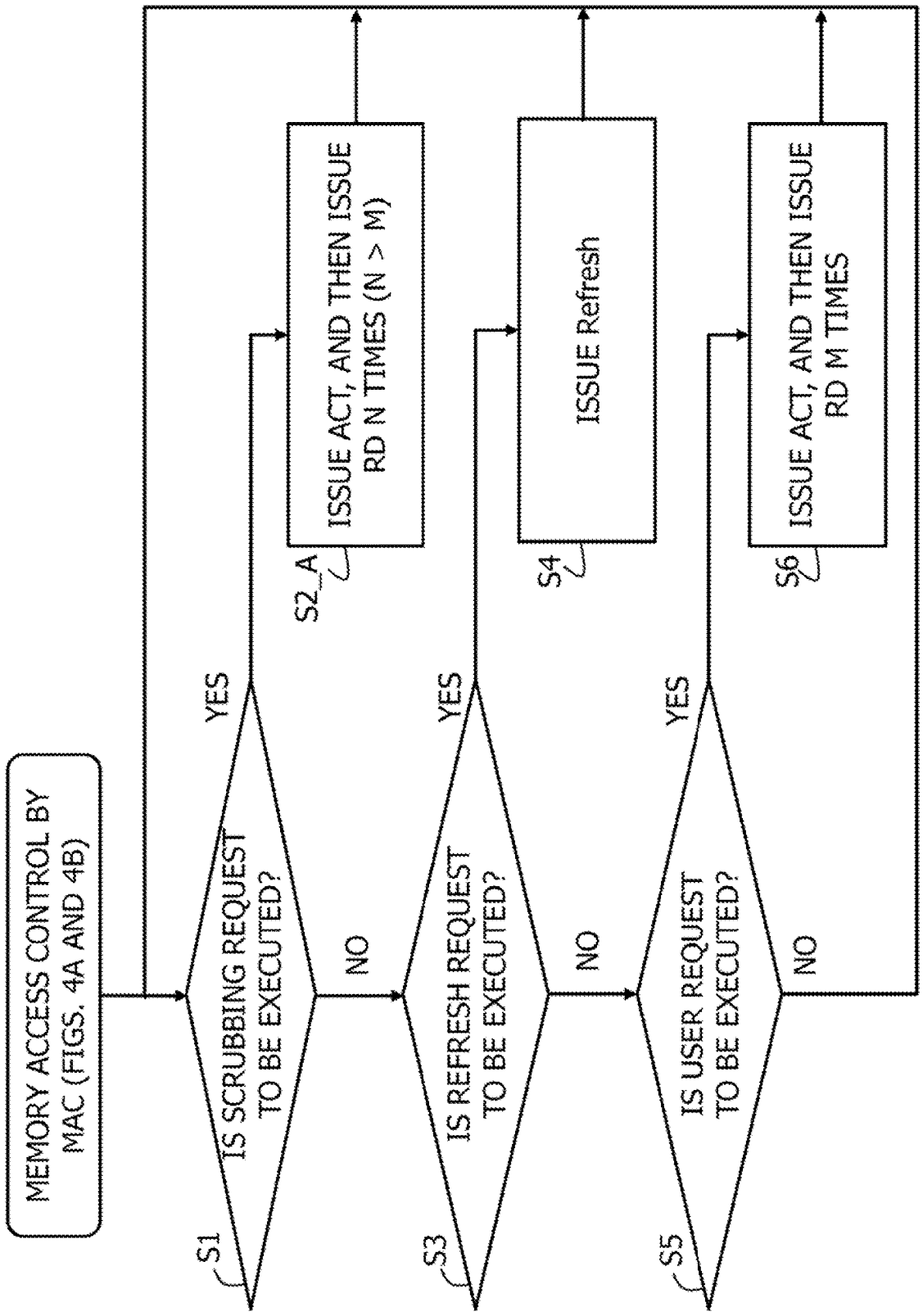
FIG. 5 illustrates a schematic flowchart of the memory access control by the MAC illustrated in FIGS. 4A and 4B.

FIG. 5 illustrates a schematic flowchart of the memory access control by the MAC illustrated in FIGS. 4A and 4B. When a scrubbing request is to be executed (YES in S1), the MAC issues active ACT to the memory via the row command bus, and thereafter issues read RD N times to the memory via the column command bus (S2_A). The number N is greater than the number M, and may be eight which is twice M or may be 4K (K=3, 4, . . . ) which is K times M. The difference from FIG. 3 is that the access length N for a scrubbing request is greater than the access length M for a user request.

When a refresh request is to be executed (YES in S3), further, the MAC issues refresh Refresh to the memory via the row command bus (S4). Read etc. are not issued to the column command bus. When a user request is executed (YES in S5), the MAC issues active ACT to the memory via the row command bus, and thereafter issues read RD M times to the memory via the column command bus (S6). The number M is four. This is the same as FIG. 3.

That is, in the present embodiment, the hardware circuit of the MAC makes the access length (number of times of read) N for a scrubbing request greater than the access length (number of times of read) M for a user request. That is, the command issuing unit of the MAC makes the number of times of issuance of a read command different between a scrubbing request and a user request.

The schematic flowchart illustrated in FIG. 5 does not indicate the order of priority in which the MAC executes a scrubbing request, a refresh request, and a user request. That is, the drawing does not indicate that a scrubbing request, a refresh request, and a user request are not executed in the order in FIG. 5 when the scrubbing request, the refresh request, and the user request are generated at the same time. FIG. 5 only indicates active ACT, read RD, and refresh Refresh are issued for the respective requests.

Next, the memory access control illustrated in the timing chart in FIGS. 4A and 4B will be described in the order of the user request, the scrubbing request, and the refresh request.

User Request

Respective reads R BG#_u (# is the number of BG) for column commands and data output from the DQ terminal in FIGS. 4A and 4B for respective active ACT BG0_u (CLK 1), active ACT BG1_u (CLK 9), active ACT BG3_u (CLK 25), active ACT BG1_u (CLK 41), and active ACT BG0_u (CLK 49) for user requests are the same as those in FIGS. 2A and 2B.

Scrubbing Request

Next, as in FIGS. 2A and 2B, active ACTBG2_s (CLK 17) for a scrubbing request is issued at clock CLK 17. In the present embodiment, the access length for scrubbing is eight, which is longer than four for a user request. Thus, eight reads R BG2*s* (CLK 32, CLK 36, CLK 40, CLK 44, CLK 48, CLK 52, CLK 56, CLK 60) are issued, starting after an interval of the command issuance constraint tRCDRD (=15) from active ACT BG2_s (CLK 17) and thereafter at intervals of tCCDL=4. That is, unlike FIGS. 2A and 2B, the four latter reads R BG2*s* (CLK 48, CLK 52, CLK 56, CLK 60) indicated by the thick boxes are issued additionally. As a result, data are output to the data terminal DQ at CLK 43, CLK 47, CLK 51, CLK 55, CLK 59, CLK 63, CLK 67, and CLK 71 after tRL=11 from each read.

Refresh Request

As in FIGS. 2A and 2B, refresh Refresh BG0 (CLK 33) is issued at clock CLK 33. For refresh, as discussed earlier, the MAC does not issue read as for a user request and does not read data from the memory. Hence, no read is issued to the column command bus COL, and no data are output from the data terminal. In the present embodiment, instead, the four latter reads R BG2*s* (CLK 48, CLK 52, CLK 56, CLK 60) for active ACT BG2_s (CLK 17) for scrubbing are issued at CLK 48, CLK 52, CLK 56, and CLK 60, which are after the command issuance constraint tRCDRD (=15) from Refresh BG0 (CLK 33) and thereafter at intervals of tCCDL=4. Likewise, data for scrubbing are output to the data terminal DQ at CLK 59, CLK 63, CLK 67, and CLK 71 which are after the latency tRL=11 from each of the four reads R BG2*s*.

At clock CLK 33, active for a user request is not able to be issued. This is because, if active for a user request were issued at clock CLK 33, reads for the active would collide with the four latter reads R BG2*s* (CLK 48, CLK 52, CLK 56, CLK 60) for active ACT BG2_s (CLK 17) for a scrubbing request. Likewise, if active for a user request were issued at clock CLK 33, the DQ terminal which would output data for reads for the active would collide with the DQ terminal (CLK 59, CLK 63, CLK 67, CLK 71) which would output data for the four latter reads R BG2*s* (CLK 48, CLK 52, CLK 56, CLK 60) corresponding to active for a scrubbing request.

Thus, if refresh for a refresh request is issued at timing CLK 33 at which active for a user request is not able to be issued, the issuance for the user request is not inhibited by the issuance of the refresh. That is, a reduction in the performance for a user request due to refresh can be concealed. As a result, the throughput of memory access for a user request can be improved. In other words, a reduction in the throughput of memory access for a user request due to refresh can be suppressed.

In summary, in the memory access control in FIGS. 2A and 2B, a user request includes one active and four reads, a scrubbing request includes one active and four reads, and a refresh includes one refresh and no reads. In the memory access control in FIGS. 4A and 4B, in contrast, a user request includes one active and four reads, a scrubbing includes one active and eight reads, and a refresh includes one refresh and no reads.

Thus, it is assumed that a user request is executed I times, a scrubbing request is executed J times, and a refresh request is executed K times (K>3). In the memory access control in FIGS. 2A and 2B, the total number of row commands (active and refresh) is I+3+K. In the memory access control in FIGS. 4A and 4B, in contrast, the total number of row commands (active and refresh) is I+K+J/2 at the minimum. In this case, the number of scrubbing request is J/2 due to the access length of scrubbing request being two times longer. This corresponds to the case where refresh is issued after active for all the J/2 scrubbing requests. In this case, J/2 refreshes do not inhibit the issuance of active for the user requests. So, the total number of row commands is I+J/2+ J/2+(K— J/2)=I+3+K−J/2. When refresh is issued L (J>L) times after active for the J/2 scrubbing requests, meanwhile, the total number of row commands (active and refresh) is I+3+K−L. Also in this case, the number of row commands is decreased, and thus a reduction in the throughput of the issuance of active for a user request is mitigated.

Example of Configuration of Memory Access Controller

Figure 6:
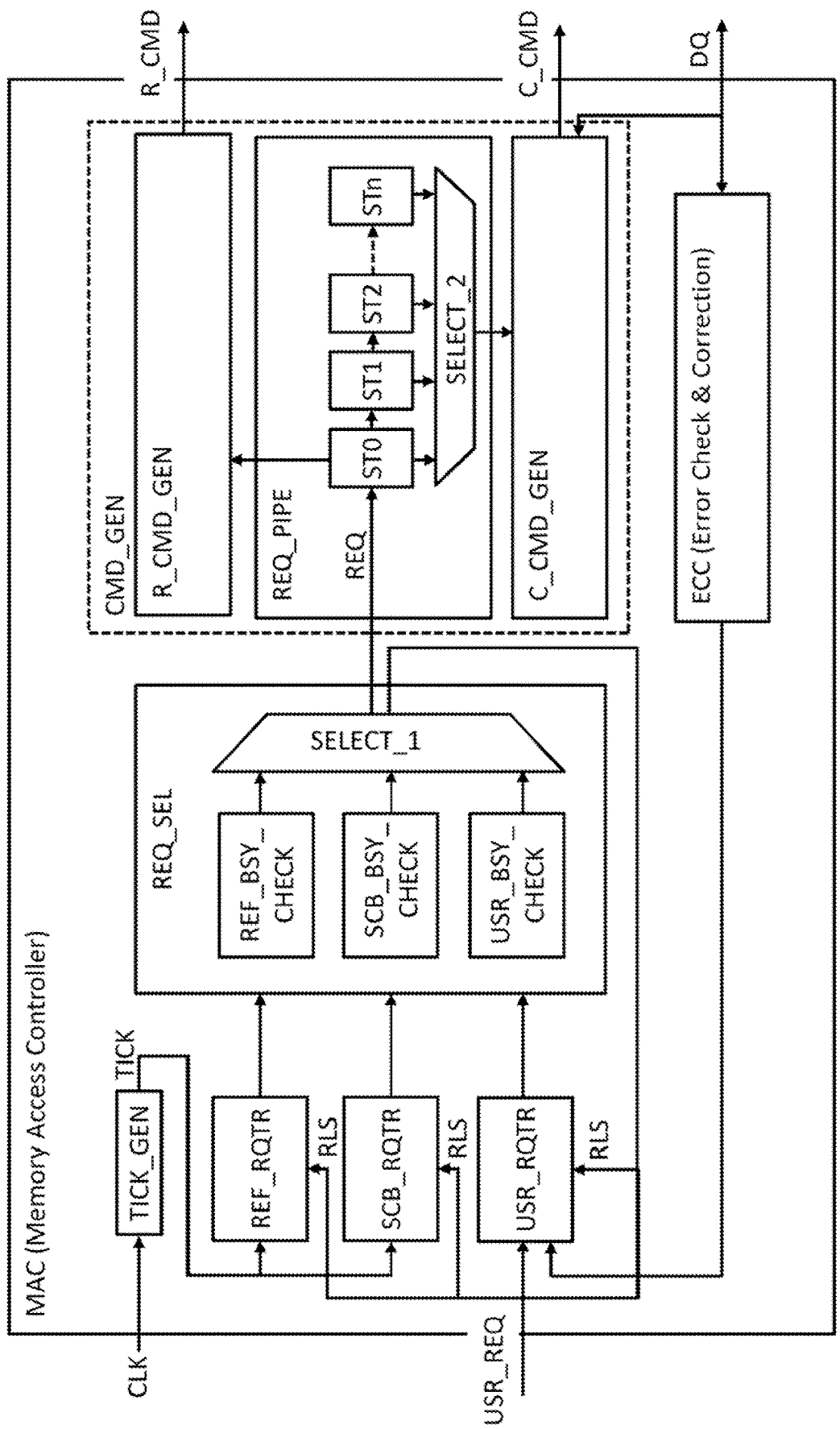
FIG. 6 illustrates an example of the configuration of the memory access controller according to the present embodiment.

FIG. 6 illustrates an example of the configuration of the memory access controller according to the present embodiment. The MAC includes requesters REF_RQTR, SCB_RQTR, and USR_RQTR that output a refresh request, a scrubbing request, and a user request, respectively, and a request select unit REQ_SEL that checks whether or not the output request meets a command issuance constraint for the memory etc. to be able to be issued and that selects a request to be issued in accordance with a predetermined priority.

The MAC further includes a timing signal generating unit TICK_GEN that counts a system clock CLK to output a timing signal TICK needed for a refresh request. The timing signal TICK is supplied to the refresh request requester REF_RQTR and the scrubbing request requester SCB_RQTR, respectively. A user request USR_REQ from the last-level cache LLC of the processor is supplied to the user request requester USR_RQTWR. That is, the user request requester USR_RQTWR outputs a user request USR_REQ supplied from the processor to the request select unit REQ_SEL. On the other hand, the refresh request requester REF_RQTR and the scrubbing request requester SCB_RQTR voluntarily output a refresh request and a scrubbing request to the request select unit REQ_SEL on the basis of the refresh period and the scrubbing period of the memory using the timing signal TICK.

The request select unit REQ_SEL includes busy check circuits REF_BSY_CHECK, SCB_BSY_CHECK, and USR_BSY_CHECK that check whether or not the input request meets a command issuance constraint etc. to be able to be issued, and a select circuit SELECT_1 that selects a request that can be issued in accordance with a predetermined priority.

The MAC further includes a command issuing unit CMD_ GEN. The command issuing unit CMD_GEN includes a request pipeline REQ_PIPE that holds a selected request REQ, a row command issuing unit R_CMD_GEN, and a column command issuing unit C_CMD_GEN. The request pipeline REQ_PIPE includes a plurality of pipeline stages ST0 to STn through which the selected request REQ flows. The request REQ input to the request pipeline REQ_PIPE outputs a row command issuance request at the initial pipeline stage ST0, and a row command R_CMD is output from the row command issuing unit R_CMD_GEN. The request REQ in each of the plurality of pipeline stages ST0 to STn holds a cycle Cycle that counts a clock after a row command is issued from the row command issuing unit after the request input to the request pipeline, and information (operation code and address) on the request. When the cycle Cycle coincides with the timing to issue a column command, the request is selected by a select circuit SELECT_2. Then, a column command C_CMD for the selected request REQ is issued from the column command issuing unit C_CMD_GEN to the column command bus at each timing.

The MAC further includes an error check and correction circuit ECC. The ECC checks an error in data read from the memory along with a scrubbing request, and executes correction of an error bit.

Figure 7:
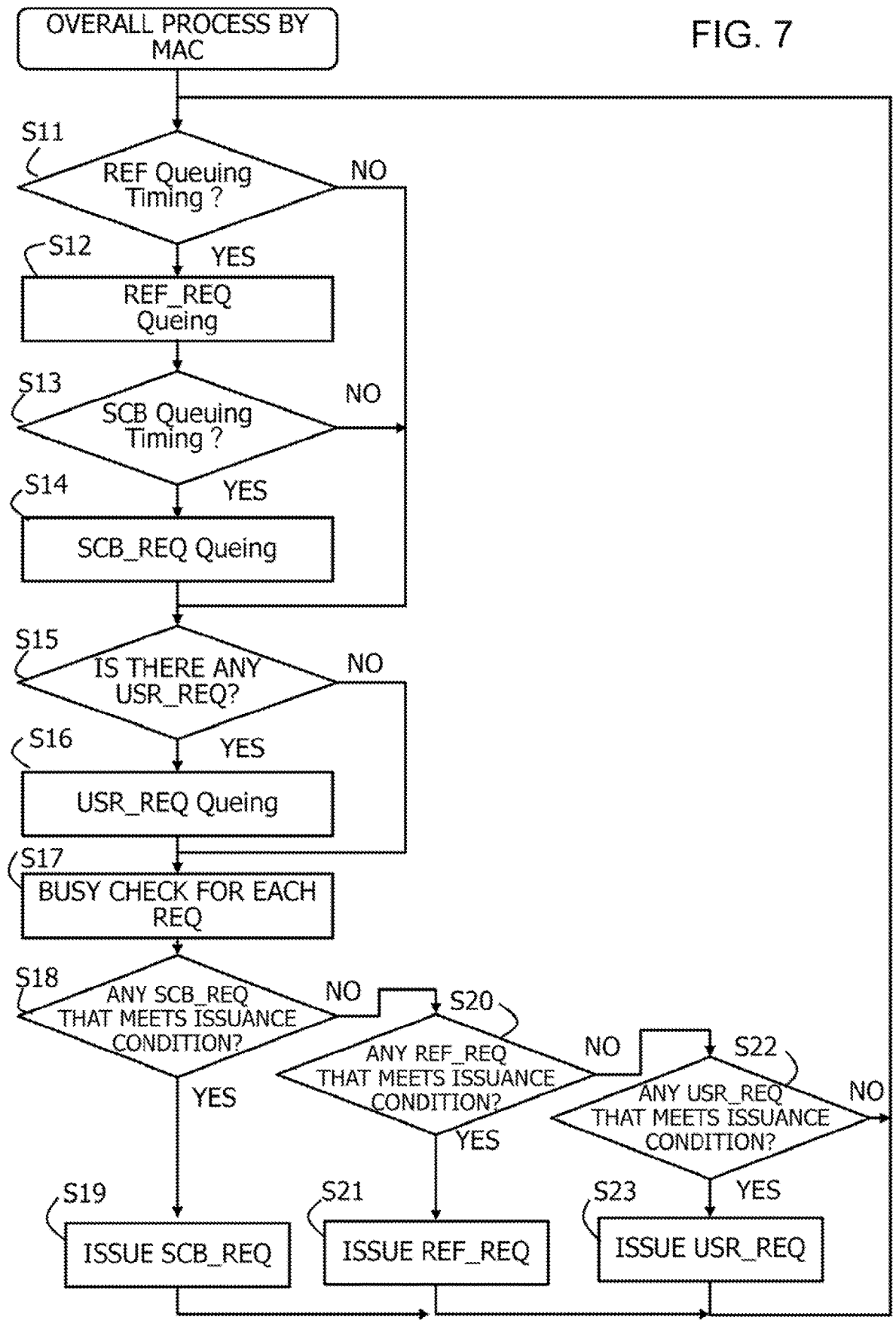
FIG. 7 illustrates a flowchart of a schematic process for the entire MAC.

FIG. 7 illustrates a flowchart of a schematic process for the entire MAC. When the queuing timing for refresh comes (YES in S11), the MAC causes a refresh request REF_REQ to queue in a queue in the refresh requester REF_RQTR (S12). When the queuing timing for scrubbing comes (YES in S13), the MAC causes a scrubbing request SCB_REQ to queue in a queue in the scrubbing requester SCB_RQTR (S14). Then, when a user request USR_REQ is received from the core and the LLC (YES in S15), the MAC causes the user request USR_REQ to queue in a queue in the user requester USR_RQTR (S16). The steps S11/S12 and the steps S13/S14 are able to be executed independently.

The refresh request, the scrubbing request, and the user request caused to queue in are output to the request select unit REQ_SEL. The queuing timing for refresh is the timing to execute refresh. Likewise, the queuing timing for scrubbing is the timing to execute scrubbing.

Next, the MAC performs a busy check for each request REQ using the three busy check circuits of the request select unit REQ_SEL (S17). When there is any scrubbing request SCB_REQ that meets the issuance condition in the busy check (YES in S18), the select circuit SELECT_1 issues the scrubbing request SCB_REQ to the command issuing unit CMD_GEN (S19). When there is no scrubbing request that meets the issuance condition (NO in S18) and there is any refresh request REF_REQ that meets the issuance condition (YES in S20), the select circuit SELECT_1 issues the refresh request to the command issuing unit CMD_GEN (S21).

When there is no refresh request that meets the issuance condition (NO in S20) and there is any user request USR_ REQ that meets the issuance condition (YES in S22), further, the select circuit SELECT_1 issues the user request USR_REQ to the command issuing unit CMD_GEN (S22). The MAC repeatedly performs the processes described above.

Configuration and Operation of Requesters

Figure 8:
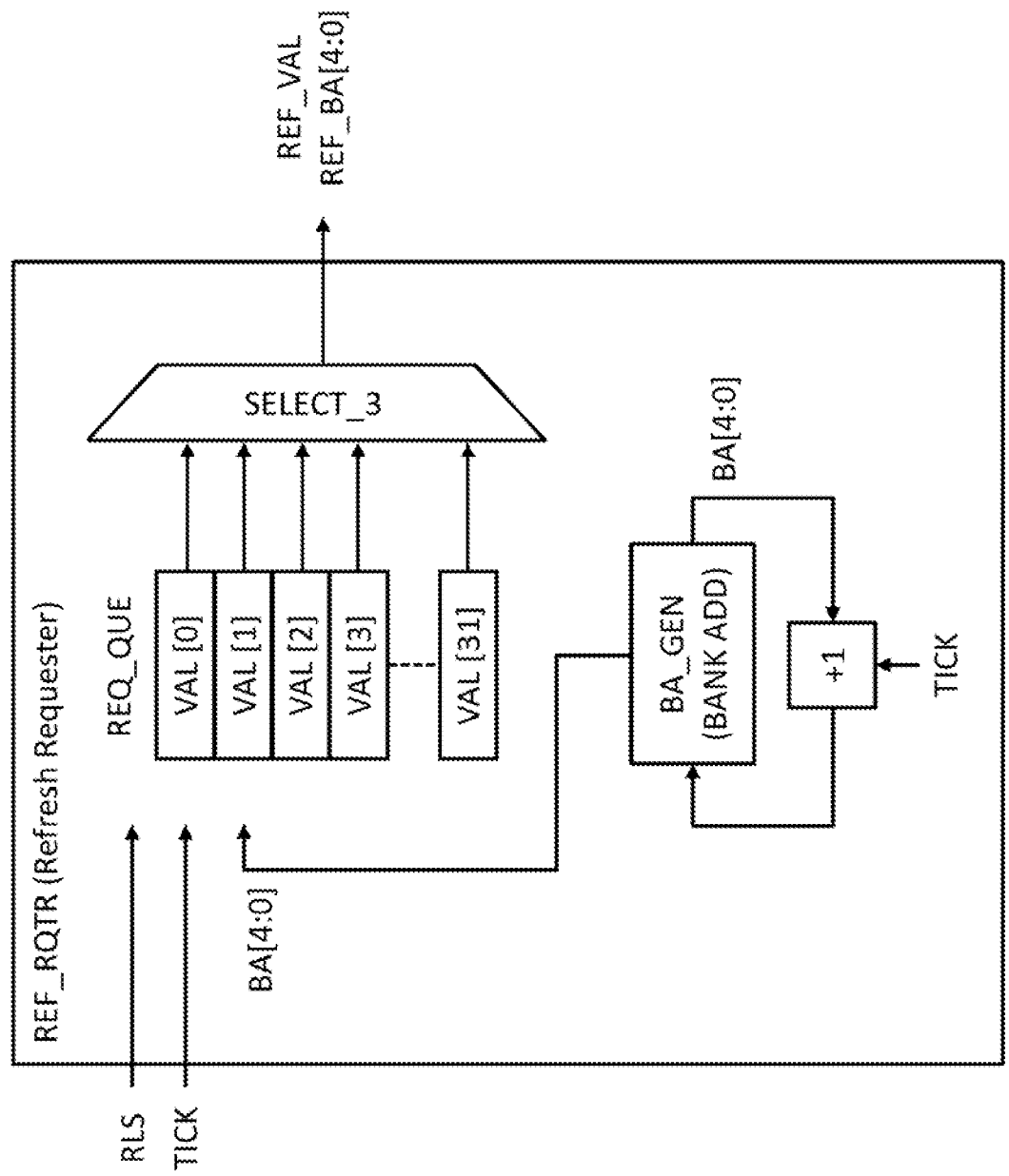
FIG. 8 illustrates an example of the configuration of the refresh requester REF_RQTR.

FIG. 8 illustrates an example of the configuration of the refresh requester REF_RQTR. Refresh is executed at a predetermined period for all the cells in the memory. Refresh needs to be executed before the state of charge of the cells is lost by leakage, and the refresh period is set based on the speed at which the state of charge of the cells is lost. In the present embodiment, the timing signal generating unit TICK_GEN illustrated in FIG. 6 counts the clock CLK, and generates a timing signal TICK at a period obtained by dividing the set refresh period by the number of the banks in the memory.

The refresh requester REF_RQTR includes a request queue REQ_QUE and a band address generating unit BA_GEN. The refresh requester causes a refresh request to queue by sequentially changing valid data VAL [0] to VAL [31] for 32 entries in the request queue REQ_QUE to "1" in synchronization with the timing when the timing signal TICK is changed to "1". The refresh requester also includes a band address generating unit BA_GEN. The bank address generating unit BA_GEN generates a bank address BA [4:0] to be newly refreshed and registers the generated bank address in the corresponding entry in the request queue REQ_QUE in synchronization with the timing when the timing signal TICK is changed to "1".

The select circuit SELECT_3 selects the valid data VAL [#] that have been changed to "1" and the corresponding bank address BA [4:0], and outputs a refresh request including the refresh valid REF_VAL (the valid data VAL [#]) and the refresh bank address REF_BA [4:0] to the refresh busy check circuit REF_BSY_CHECK of the request selector.

Then, as discussed later, when the request select unit REQ_SEL issues a refresh request to the command issuing unit CMD_GEN, the request select circuit issues a release signal RLS for releasing the refresh request. The refresh requester REF_RQTR changes the corresponding valid data VAL [#] in the request queue to "0" in response to the release signal RLS.

Figure 9:
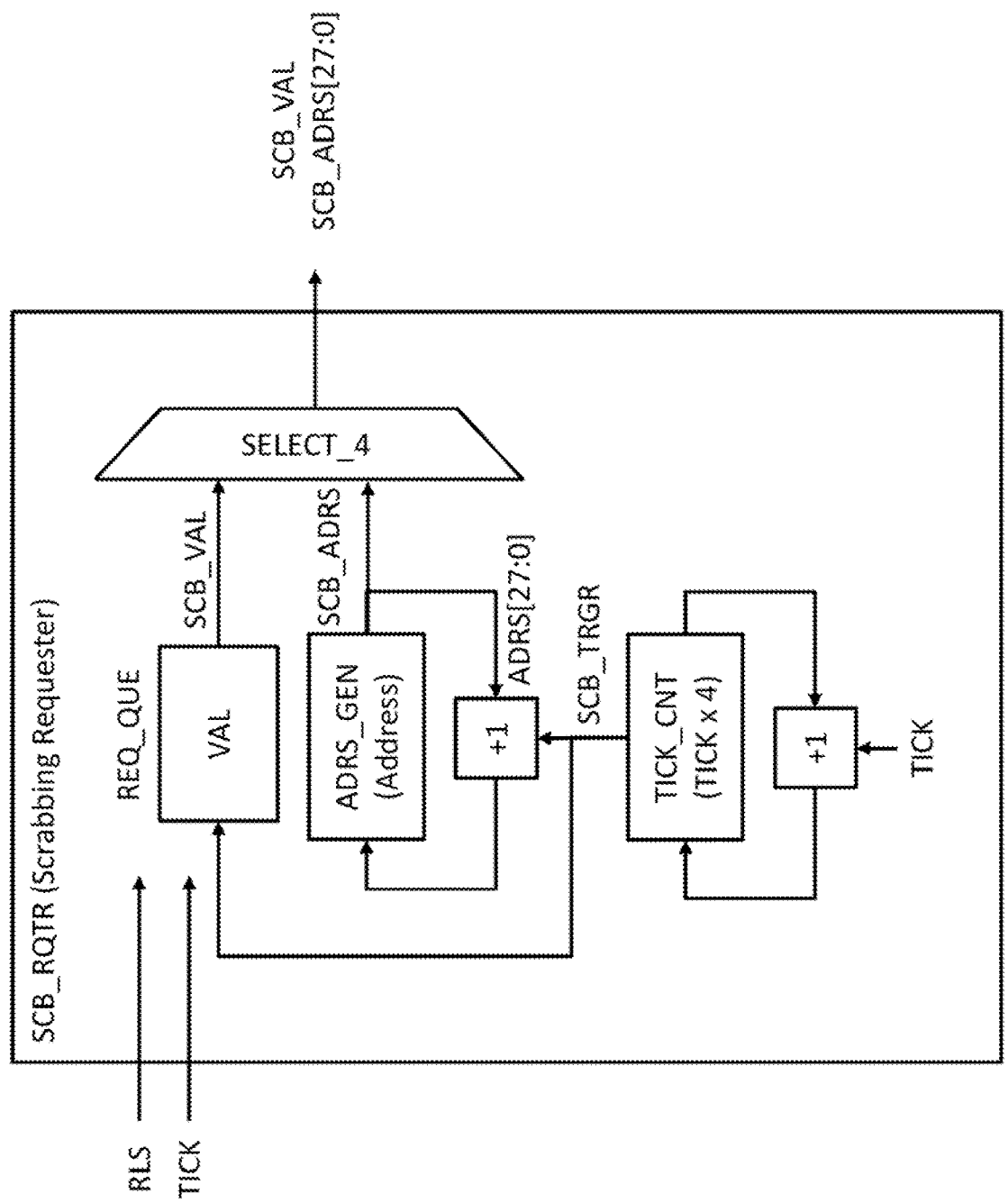
FIG. 9 illustrates an example of the configuration of the scrubbing requester SCB_RQTR.

FIG. 9 illustrates an example of the configuration of the scrubbing requester SCB_RQTR. Scrubbing is executed at a predetermined period for all the cells in the memory. Scrubbing needs to be executed before it is made impossible to correct an error for bit inversion of the cells using the error check and correction circuit. The scrubbing period is set based on the probability etc. of the occurrence of bit inversion of the cells due to irradiation by cosmic rays etc.

In the present embodiment, the timing to execute scrubbing is set to once for K timing signals TICK. The number K may be four, for instance. Thus, the scrubbing requester includes a TICK counter TICK_CNT that counts timing signals TICK, and outputs a scrubbing trigger signal SCB_TRIG each time the TICK counter counts K timing signals TICK.

The scrubbing requester includes a request queue REQ_QUE that has one entry and a scrubbing address generating circuit ADRS_GEN. Each time a scrubbing trigger signal SCB_TRIG is generated, the valid for the entry of the request queue REQ_QUE is changed to "1", and the scrubbing address generating circuit increments the scrubbing address. Then, a select circuit SELECT_4 outputs a scrubbing request that includes a scrubbing valid SCR_VAL (=1) and a scrubbing address SCB_ADRS [27:0] to the scrubbing busy check circuit SCB_BSY_CHECK of the request selector.

Then, as discussed later, when the request select unit REQ_SEL issues a scrubbing request to the command issuing unit CMD_GEN, the request select unit issues a release signal RLS for releasing the scrubbing request. The scrubbing requester SCB_RQTR changes the valid data in the request queue REQ_QUE to "0" in response to the release signal RLS.

Figure 10:
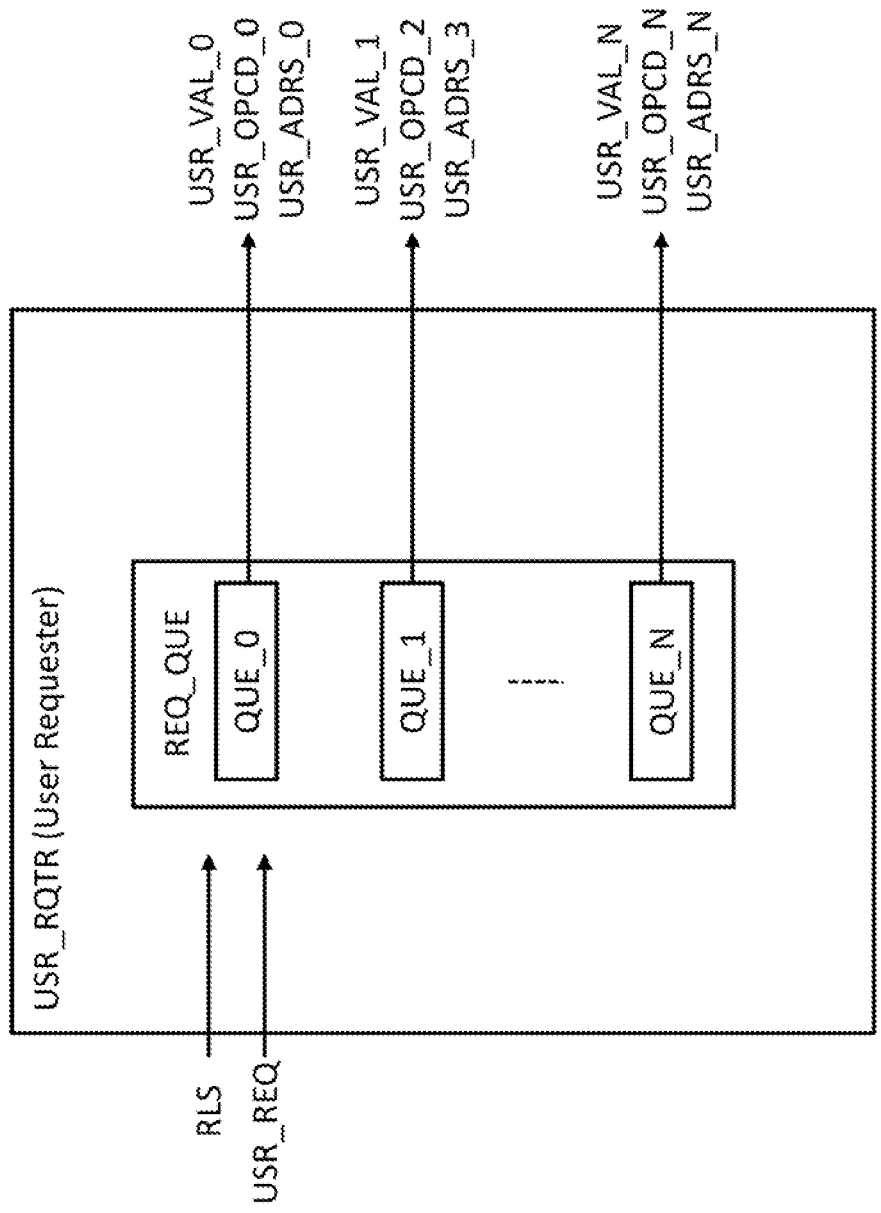
FIG. 10 illustrates an example of the configuration of the user requester USR_RQTR.

FIG. 10 illustrates an example of the configuration of the user requester USR_RQTR. The request queue REQ_QUE in the user requester has a plurality of, e.g. N+1, entries, and registers information on the user request USR_REQ from the core and the LLC in a vacant entry. The information to be registered includes a user valid USR_VAL_#, a user operation code USR_OPCD_#, and a user address USR_ADRS_#. Symbol "#" indicates the number of the entries 0 to N. Then, the information in all the entries is output, as a user request, to the user busy check circuit USR_BSY_CHECK of the request select unit REQ_SEL.

Likewise, when the request select unit REQ_SEL issues a user request to the command issuing unit CMD_GEN, the request select unit issues a release signal RLS for releasing the user request. The user requester USR_RQTR changes the user valid USR_VAL_# for the corresponding entry in the request queue REQ_QUE to "0" in response to the release signal RLS.

Configuration and Operation of Request Selector (Request Select Unit)

Figure 11:
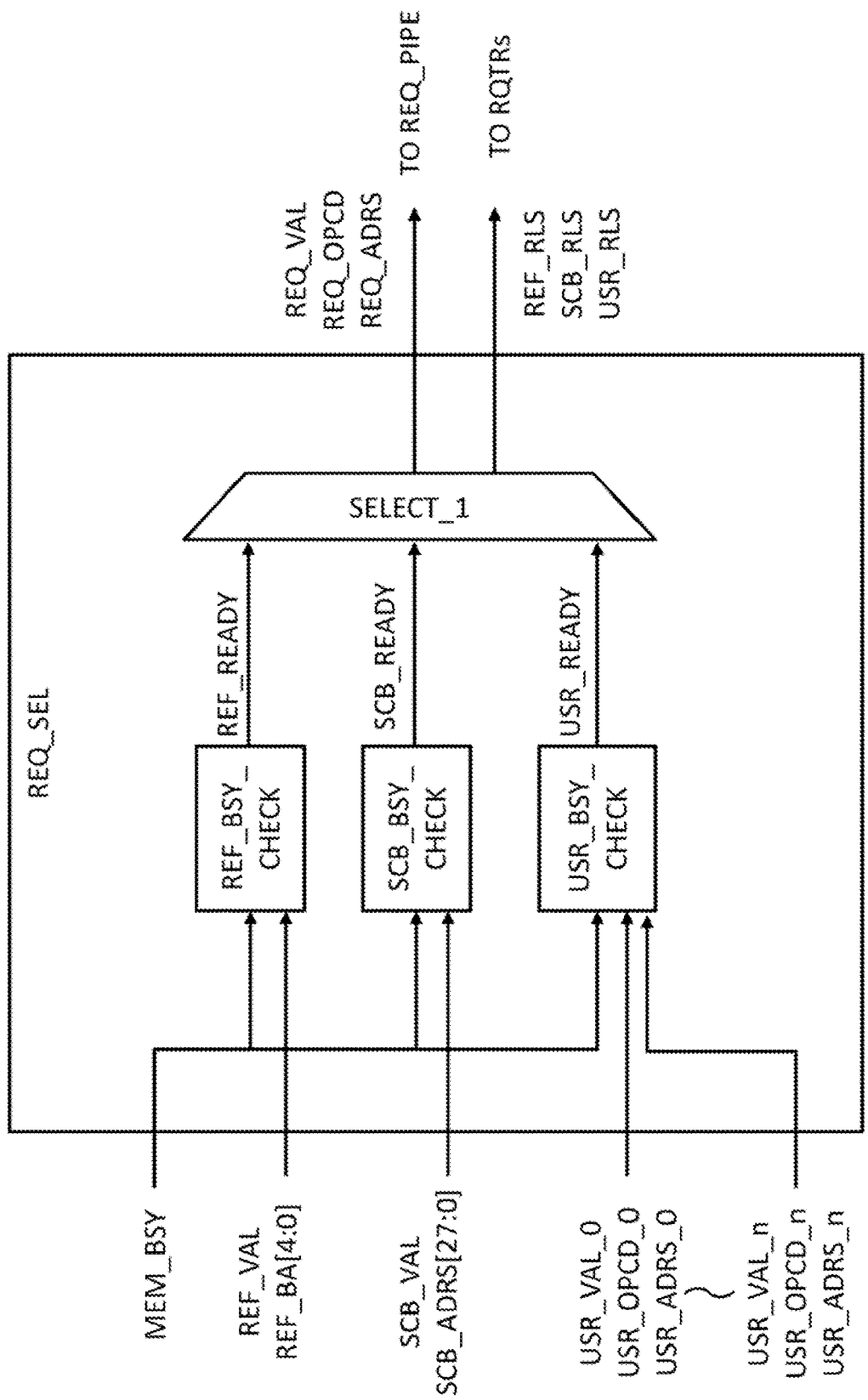
FIG. 11 illustrates an example of the configuration of the request selector (request select unit).

FIG. 11 illustrates an example of the configuration of the request selector (request select unit). The request select unit REQ_SEL includes three busy check circuits REF_BSY_CHECK, SCB_BSY_CHECK, and USR_BSY_CHECK. The busy check circuits check whether or not the corresponding request meets the issuance condition. The valid VAL, the address BA [4:0], ADRS, and the operation code OPCD output from the requesters REF_RQTR, SCB_RQTR, and USR_RQTR are input to the respective busy check circuits. In addition, a busy signal MEM_BSY corresponding to the command issuance constraint for the memory is supplied to the busy check circuits. As discussed earlier, the memory has a plurality of command issuance constraints, and the busy signal MEM_BSY includes busy signals each corresponding to the plurality of command issuance constraints. The busy signal may be a signal changed to a predetermined level (0 or 1) during a period for which the issuance of a command is prohibited, for instance.

When each request meets the issuance conditions, the busy check circuits change ready signals REF_READY, SCB_READY, and USR_READY to "1" to indicate that such requests are candidates to be selected by the select circuit SELECT_1.

In addition, the request select unit REQ_SEL includes a select circuit SELECT_1. The select circuit SELECT_1 selects, when one of the ready signals REF_READY, SCB_READY, and USR_READY output from the three busy check circuits is "1", one of the refresh request, the scrubbing request, and the user request, for which the ready signal is "1", based on a predetermined priority.

Operation of the three busy check circuits will be described below. Further, operation of the select circuit SELECT_1 will be described.

Figure 12:
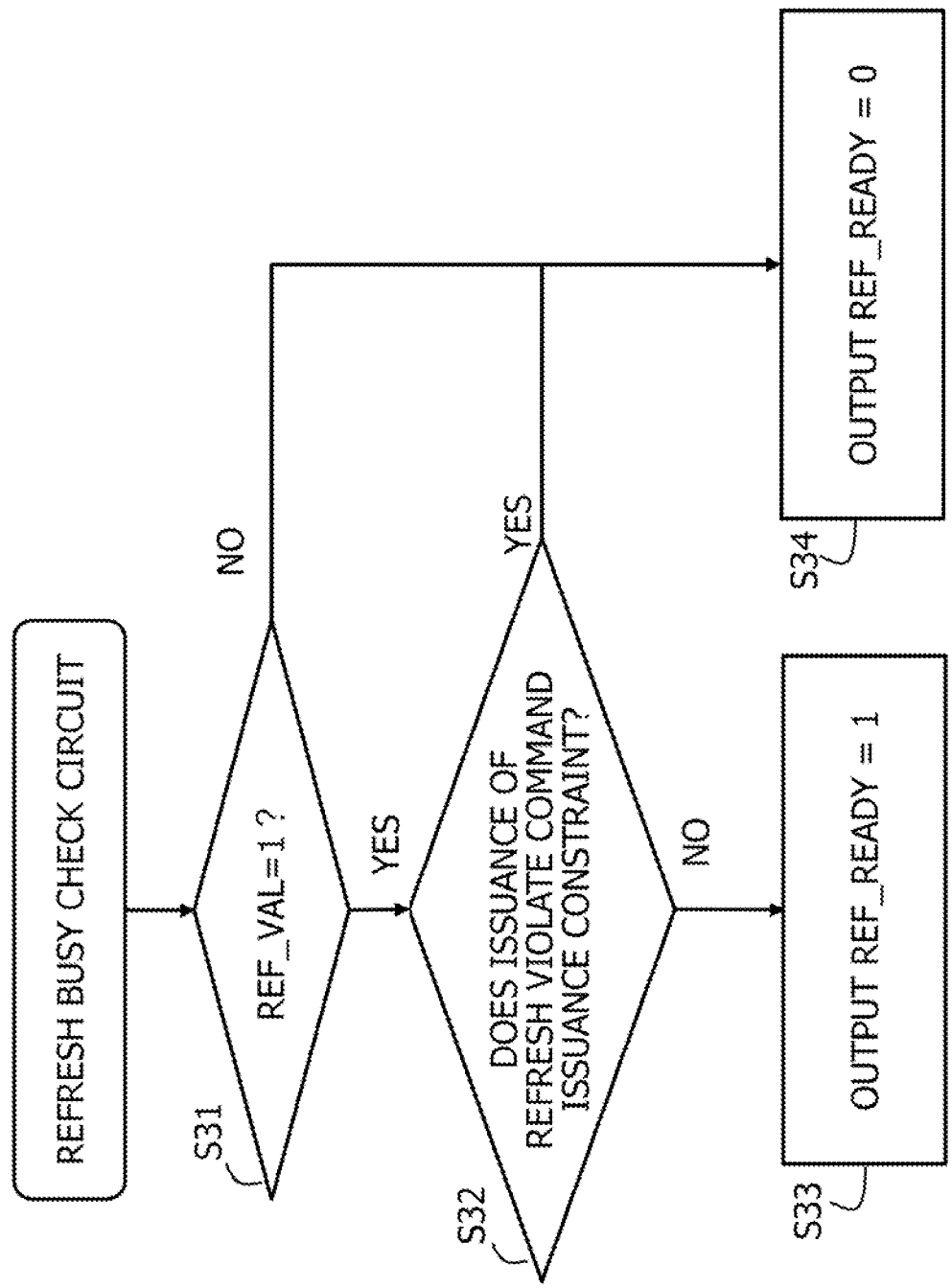
FIG. 12 illustrates a flowchart of operation of the refresh busy check circuit REF_BSY_CHECK.

FIG. 12 illustrates a flowchart of operation of the refresh busy check circuit REF_BSY_CHECK. When the refresh valid REF_VAL=1 is met (YES in S31) and the issuance of refresh does not violate the command issuance constraints (NO in S32), the refresh busy check circuit outputs a refresh ready signal REF_REDY=1 (S33).

The command issuance constraints for refresh include a delay tRRDS(=8) between active and refresh in different bank groups and a delay tRREFD between refresh and refresh in different bank groups, for instance. tRRDS(=8) exists between CLK 25 and CLK 33 in FIG. 4A.

When the refresh valid REF_VAL=0 is met (NO in S31) or the issuance of refresh violates the command issuance constraints (YES in S32), the refresh busy check circuit outputs a refresh ready signal REF_REDY=0 (S34).

Figure 13:
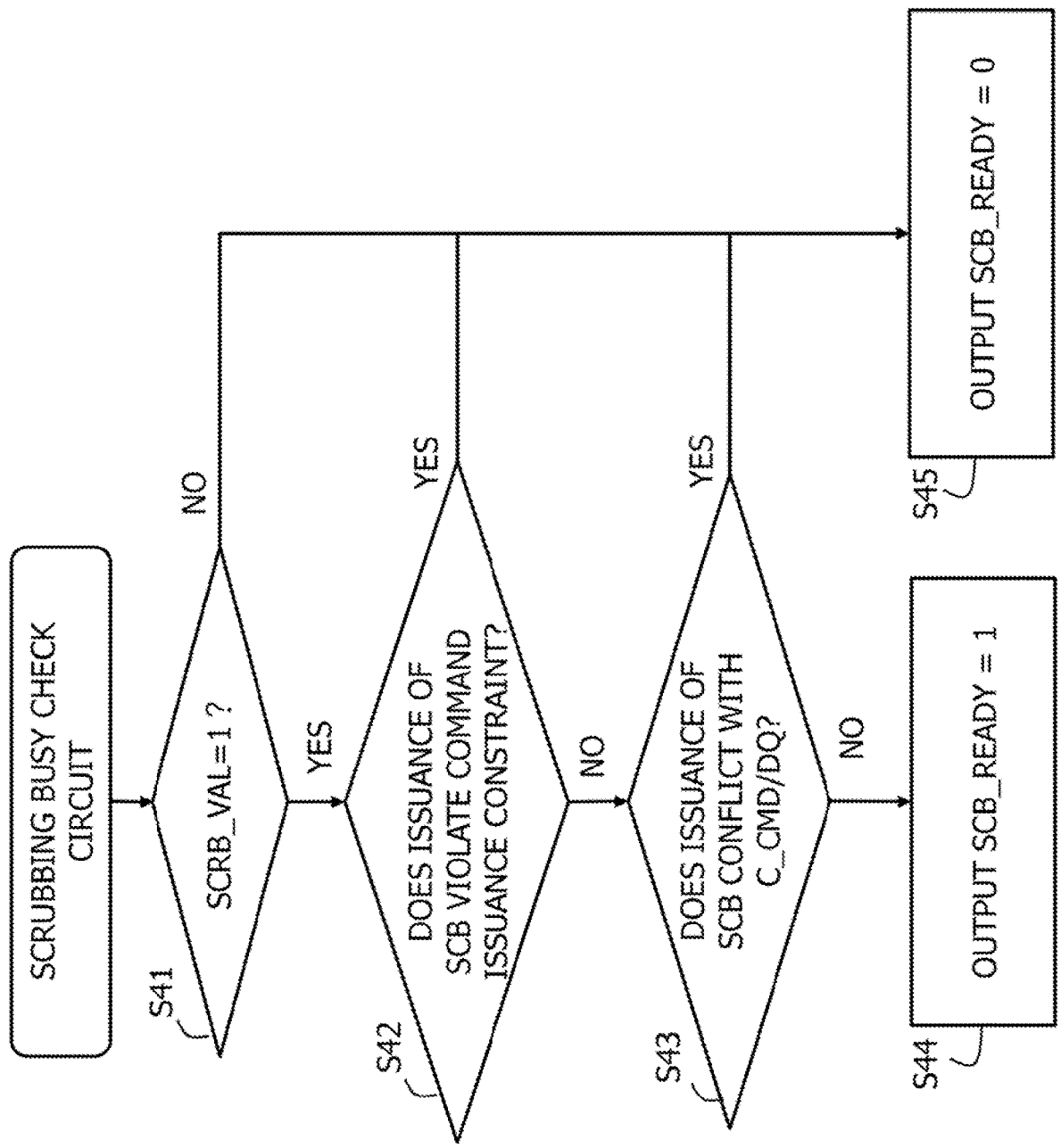
FIG. 13 illustrates a flowchart of operation of the scrubbing busy check circuit SCB_BSY_CHECK.

FIG. 13 illustrates a flowchart of operation of the scrubbing busy check circuit SCB_BSY_CHECK. When the scrubbing valid SCB_VAL=1 is met (YES in S41), the issuance of scrubbing does not violate the command issuance constraints (NO in S42), and the issuance of scrubbing does not cause a conflict with the column command C_CMD or the DQ terminal (NO in S43), then the scrubbing busy check circuit outputs a scrubbing ready signal SCB_REDY=1 (S44).

The command issuance constraints for scrubbing include a delay tRRDS(=8) between active and active in different bank groups and a delay tRREFD between refresh and active in different bank groups, for instance. tRRDS(=8) exists between CLK 9 and CLK 17 in FIG. 4A.

The conflict of the column command C_CMD is that the issuance of eight reads R BG2s (CLK 32, CLK 36, CLK 40, CLK 44, CLK 48, CLK 52, CLK 56, CLK 60) for active ACT BG2_s (CLK 17) for scrubbing conflicts with the issuance of reads for different active in FIG. 4A. Meanwhile, the conflict of the DQ terminal is that data output at CLK 43, CLK 47, CLK 51, CLK 55, CLK 59, CLK 63, CLK 67, and CLK 71, which are after the latency tRL=11 from the eight reads R BG2s for scrubbing, respectively, conflicts with different data output in FIG. 4B.

When the scrubbing valid SCB_VAL=0 is met (NO in S41), when the issuance of scrubbing violates the command issuance constraints (YES in S42), or when the issuance of scrubbing causes a conflict of the column command C_CMD or the DQ terminal (YES in S43), then the scrubbing busy check circuit outputs a scrubbing ready signal SCB_REDY=0 (S45).

Figure 14:
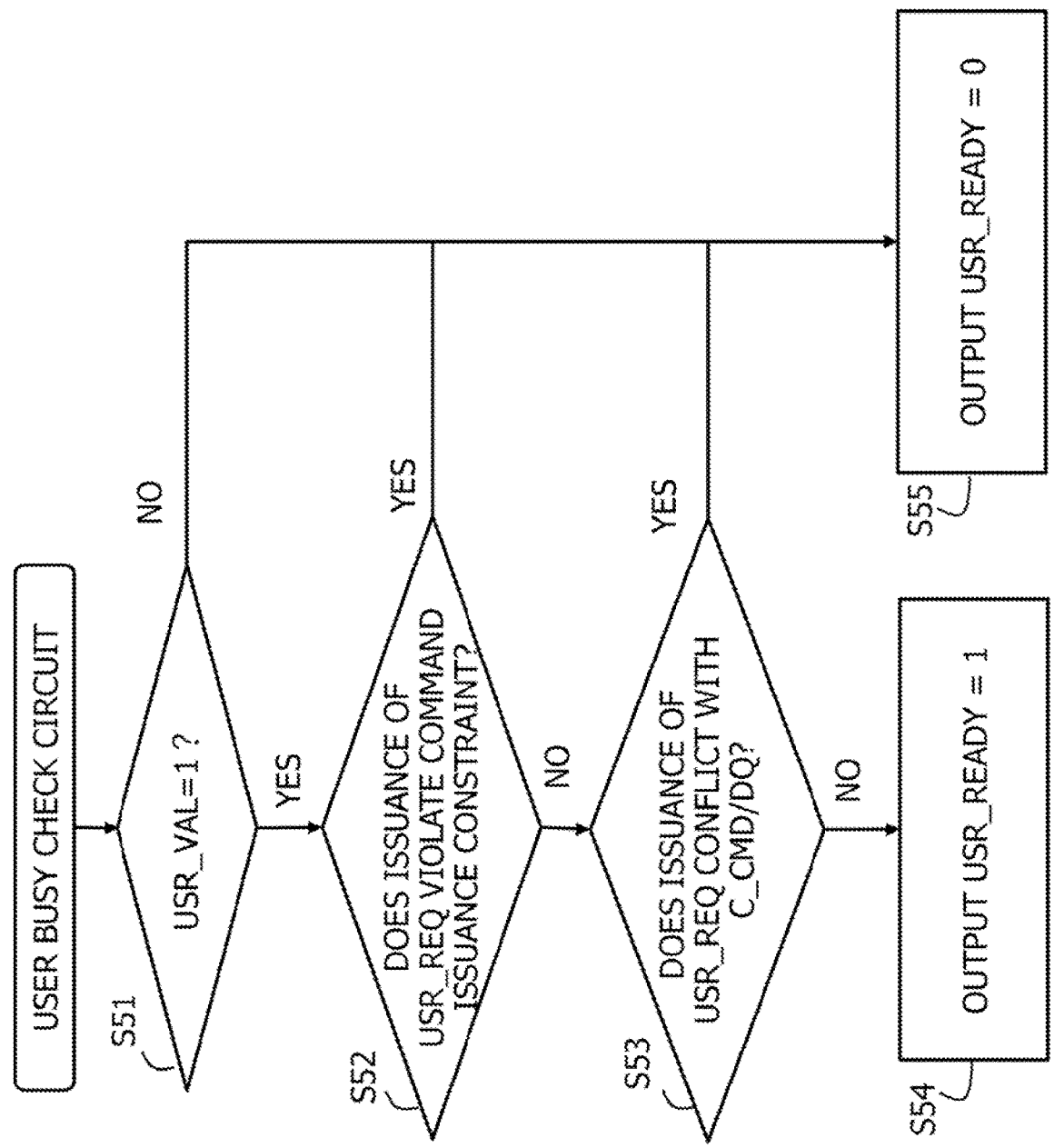
FIG. 14 illustrates a flowchart of operation of the user busy check circuit USR_BSY_CHECK.

FIG. 14 illustrates a flowchart of operation of the user busy check circuit USR_BSY_CHECK. Operation of the user busy check circuit is the same as that of the scrubbing busy check circuit in FIG. 13.

That is, when the user valid USR_VAL=1 is met (YES in S51), the issuance of a user request does not violate the command issuance constraints (NO in S52), and the issuance of a user request does not cause a conflict with the column command C_CMD or the DQ terminal (NO in S53), then the user busy check circuit outputs a user ready signal USR_REDY=1 (S54).

When the user valid USR_VAL=0 is met (NO in S51), when the issuance of a user request violates the command issuance constraints (YES in S52), or when the issuance of a user request causes a conflict with the column command C_CMD or the DQ terminal (YES in S53), then the user busy check circuit outputs a user ready signal USR_REDY=0 (S55).

Figure 15:
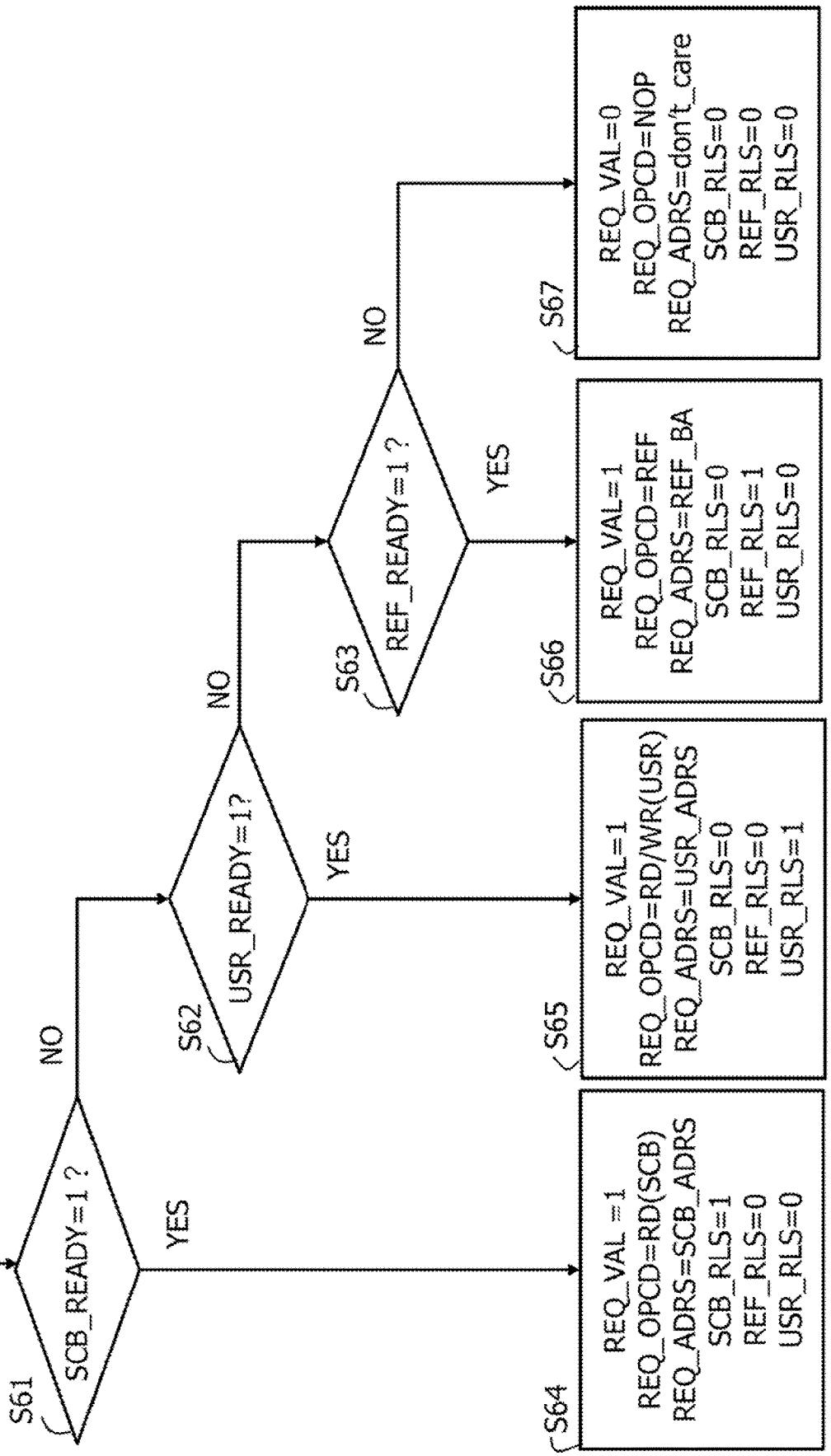
FIG. 15 illustrates a flowchart of operation of the select circuit SELECT_1 of the request selector REQ_SEL.

FIG. 15 illustrates a flowchart of operation of the select circuit SELECT_1 of the request selector REQ_SEL. The select circuit selects the scrubbing request, the user request, and the refresh request in this order, that is, in accordance with the order of priority.

The select circuit first checks whether or not scrubbing ready SBC_READY=1 is met (S61). When SCB_READY=1 is met (YES in S61), the select circuit outputs a scrubbing request including the following data to the request pipeline REQ_PIPE of the command issuing unit CMD_GEN (S64).
REQ_VAL=1
REQ_OPCD=RD(SCB)
REQ_ADRS=SCB_ADRS
SCB_RLS=1
REF_RLS=0
USR_RLS=0

REQ_VAL indicates the request valid signal, REQ_OPCD indicates the request operation code, REQ_ADRS indicates the request address, SCB_ADRS indicates the scrubbing address, and RLS indicates the release signal. As illustrated in FIG. 6, the select circuit returns a release signal to the scrubbing requester SCB_RQTR as a signal for withdrawing a scrubbing request when scrubbing is issued.

Secondly, when scrubbing ready SCB_READY=0 is met (NO in S61), the select circuit checks whether or not user ready USR_READY=1 is met (S62). When USR_READY=1 is met (YES in S62), the select circuit outputs a user request including the following data to the request pipeline REQ_PIPE of the command issuing unit CMD_GEN (S65).
REQ_VAL=1
REQ_OPCD=RD/WR(USR)
REQ_ADRS=USR_ADRS
SCB_RLS=0
REF_RLS=0
USR_RLS=1

RD/WR(USR) indicates read or write, and USR_ADRS indicates the user address.

Thirdly, when user ready USR_READY=0 is met (NO in S62), the select circuit checks whether or not refresh ready REF_READY=1 is met (S63). When REF_READY=1 is met (YES in S63), the select circuit outputs a refresh request including the following data to the request pipeline REQ_PIPE of the command issuing unit CMD_GEN (S66).
REQ_VAL=1
REQ_OPCD=REF
REQ_ADRS=REF_BA
SCB_RLS=0
REF_RLS=1
USR_RLS=0

REF indicates refresh, and REF_BA indicates the refresh bank address.

As illustrated in the flowchart in FIG. 15, when the three ready signals are all "1", the select circuit SELECT_1 selects a scrubbing request, and issues a scrubbing request to the request pipeline REQ_PIPE of the command issuing unit CMD_GEN. It is assumed that ready signals for a user request for the bank group BG0, a refresh request for BG0, and a scrubbing request for BG2 are all "1" at clock CLK 17 in FIG. 4A, for instance. In this case, the select circuit preferentially issues a scrubbing request.

As a result of the issuance of active ACT BG2_s for a scrubbing request (CLK 17), the ready signal for the scrubbing request is returned to "0". Then, at the timing of clock CLK 33, if a user request is assumed to be issued at CLK 33, four reads for the user request issued at CLK 33 would be issued at CLK 48 to CLK 60, and conflict with the latter four reads R BG2s (CLK 48 to CLK 60) for active ACT BG2_s (CLK 17) for the scrubbing request. Thus, at CLK 33 the ready signal for the user request is changed to "0" based on FIG. 14. As a result, the select circuit selects a refresh request for BG0, and the row command issuing unit R_CMD_GEN of the command issuing unit issues refresh Refresh BG0 (CLK 33).

When a refresh request is issued to the command issuing unit, the select circuit feeds a release signal for the refresh request back to the refresh busy check circuit. As a result, the refresh ready signal is changed to "0". After that, the select circuit selects the user request that was not issued because of a conflict of the issue timings of the corresponding read commands and issues the user request to the request pipeline of the command issuing unit. As a result, the active ACT BG1_u is issued at CLK 41.

In the present embodiment, the requesters REF_RQTR and SCB_RQTR make a refresh request and a scrubbing request in synchronization with each other based on the refresh timing signal TICK. Consequently, the select circuit SELECT_1 reliably issues a row command Refresh BG0 (CLK 33) for a refresh request at clock CLK 33 in synchronization with the timing of the issuance of a scrubbing request (active ACT BG2_s (CLK 17)). At clock CLK 33, active for a user request is not able to be issued. So, issuing the refresh command at CLK 33 does not prevent the issuance of an active command for a user request. As a result, a reduction in the performance to issue a user request due to refresh can be concealed at a high probability.

As a matter of course, refresh is issued at the timing when active for a user request is not able to be issued after active for a scrubbing request is issued if the issuance of a scrubbing request and the issuance of a refresh request are temporally close to each other probabilistically, even if a refresh request and a scrubbing request are not synchronized with each other. In that case, a reduction in the performance to issue a user request due to refresh can be concealed in the same manner as described above.

Configuration and Operation of Command Issuing Unit

As illustrated in FIG. 6, the command issuing unit R_CMD_GEN includes a request pipeline REQ_PIPE, a row command issuing unit R_CMD_GEN, and a column command issuing unit C_CMD_GEN. The configuration and operation of these will be described below.

As described with reference to FIG. 6, the request pipeline REQ_PIPE includes a plurality of pipeline stages ST0 to STn that hold information on the selected request REQ. The request REQ input to the request pipeline REQ_PIPE outputs a row command issuance request to the row command issuing unit R_CMD_GEN at the initial pipeline stage ST0. In addition, each request REQ in the plurality of pipeline stages ST0 to STn is selected by the select circuit SELECT_2 and output to the column command issuing unit C_CMD_GEN when the timing to issue each column command comes. The pipeline stages ST0 to STn each hold a cycle CYCLE that indicates the number of clocks CLK after a row command is issued. The cycle CYCLE is used to determine the timing to issue the initial one of sequential column commands.

Figure 16:
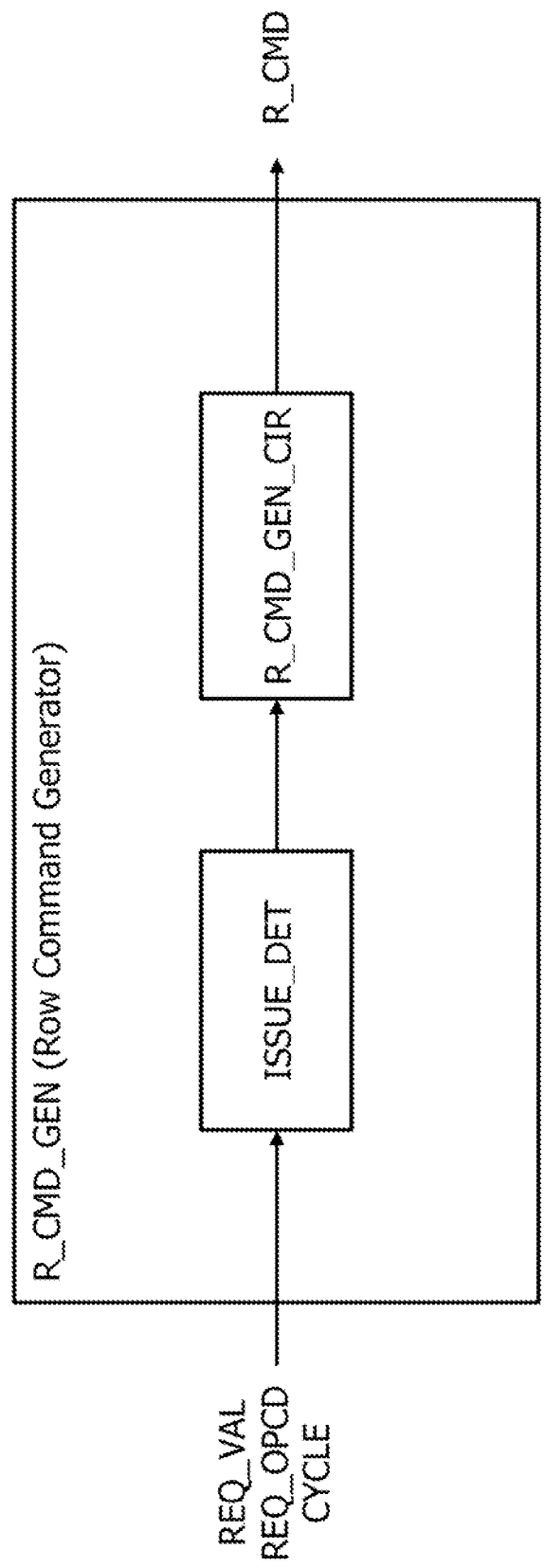
FIG. 16 illustrates an example of the configuration of the row command issuing unit R_CMD_GEN.
Figure 17:
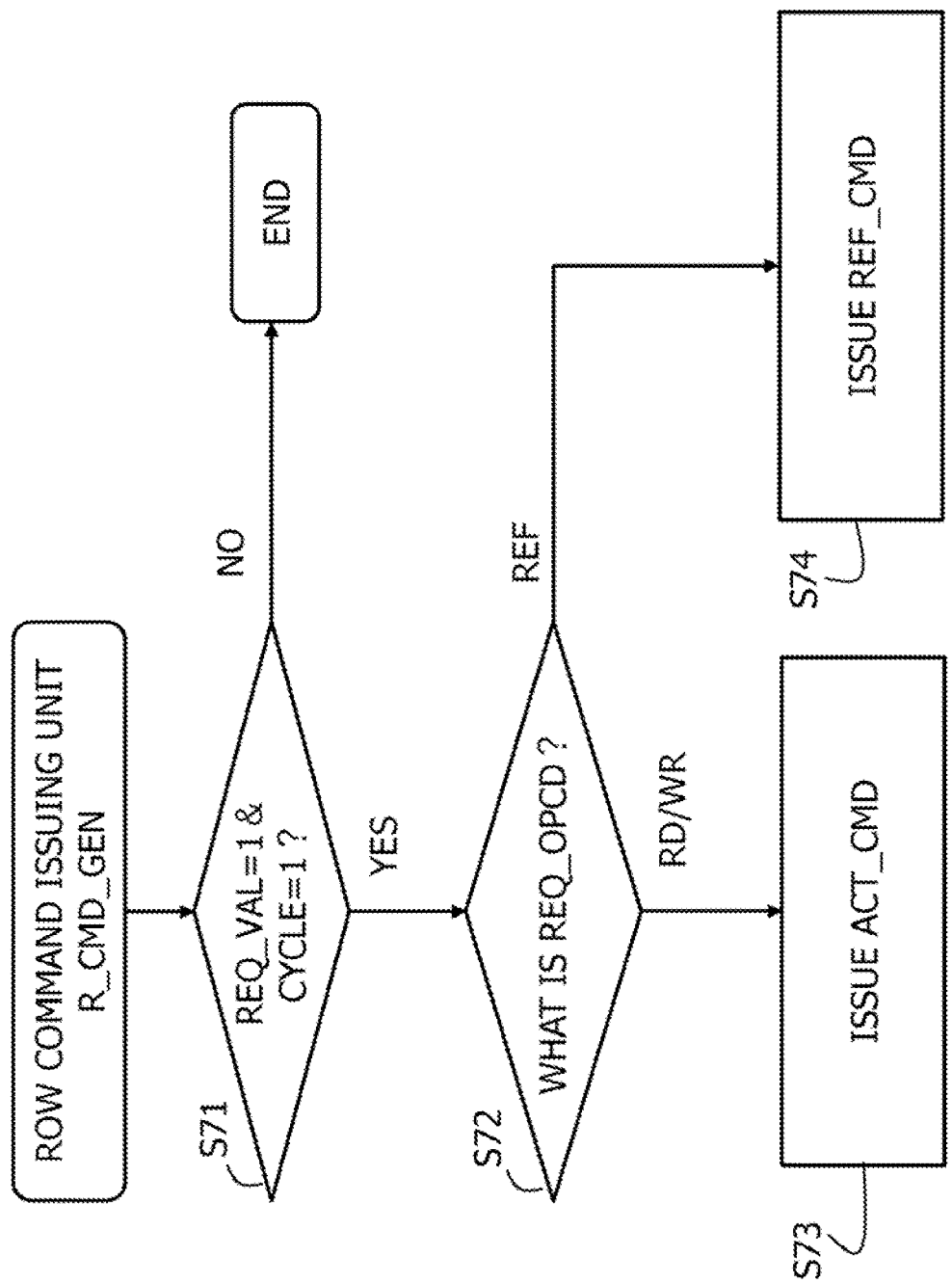
FIG. 17 illustrates a flowchart of an example of operation of the row command issuing unit.

FIG. 16 illustrates an example of the configuration of the row command issuing unit R_CMD_GEN. FIG. 17 illustrates a flowchart of an example of operation of the row command issuing unit. The row command issuing unit R_CMD_GEN includes an issuance determination circuit ISSUE_DET and a row command issuing circuit R_CMD_GEN_CIR. The request valid REQ_VAL, the request operation code REQ_OPCD, and the cycle CYCLE are input to the issuance determination circuit ISSUE_DET as information on a request from the initial pipeline stage ST0 of the request pipeline REQ_PIPE.

As illustrated in FIG. 17, the row command issuing unit determines whether or not the request valid REQ_VAL=1 is met and the cycle CYCLE=1 is met (S71). When the determination in S71 is NO, the row command issuing unit does not issue a row command. When the determination in S71 is YES, the row command issuing unit determines whether the request operation code is refresh REF or read or write RD/WR (S72). When the determination in S72 is read or write RD/WR, the row command issuing circuit R_CMD_GEN_CIR issues an active command ACT_CMD to the row command bus (S73). When the determination in S72 is refresh, on the other hand, the row command issuing circuit R_CMD_GEN_CIR issues a refresh command REF_CMD to the row command bus (S74). The active command ACT_CMD is active ACT in FIGS. 2A and 2B and FIGS. 4A and 4B. The refresh command REF_CMD is refresh Refresh in FIGS. 2A and 2B and FIGS. 4A and 4B. The determinations in S71 and S72 described above are made by the issuance determination circuit ISSUE_DET.

Figure 18:
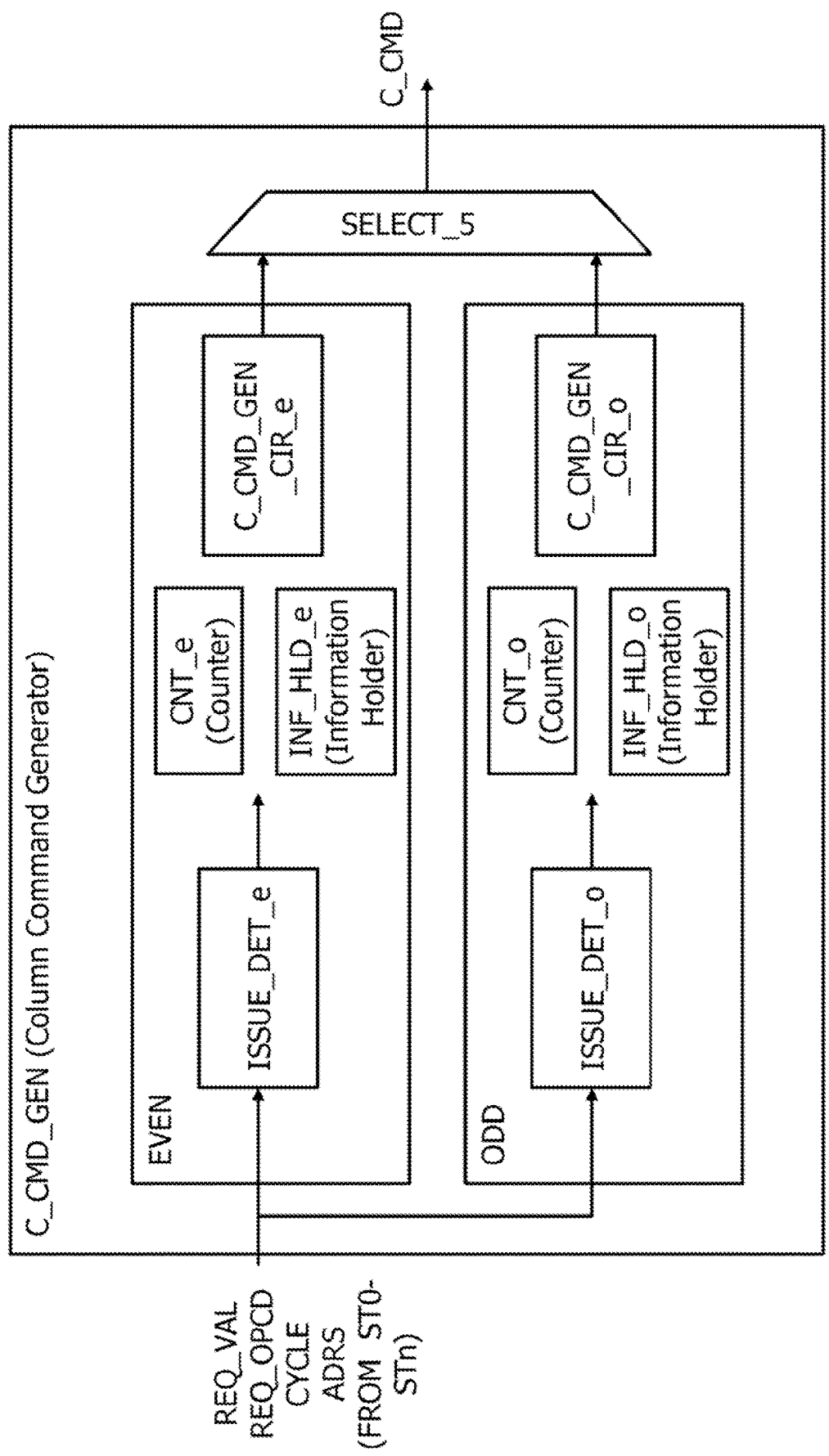
FIG. 18 illustrates an example of the configuration of the column command issuing unit C_CMD_GEN.
Figure 19:
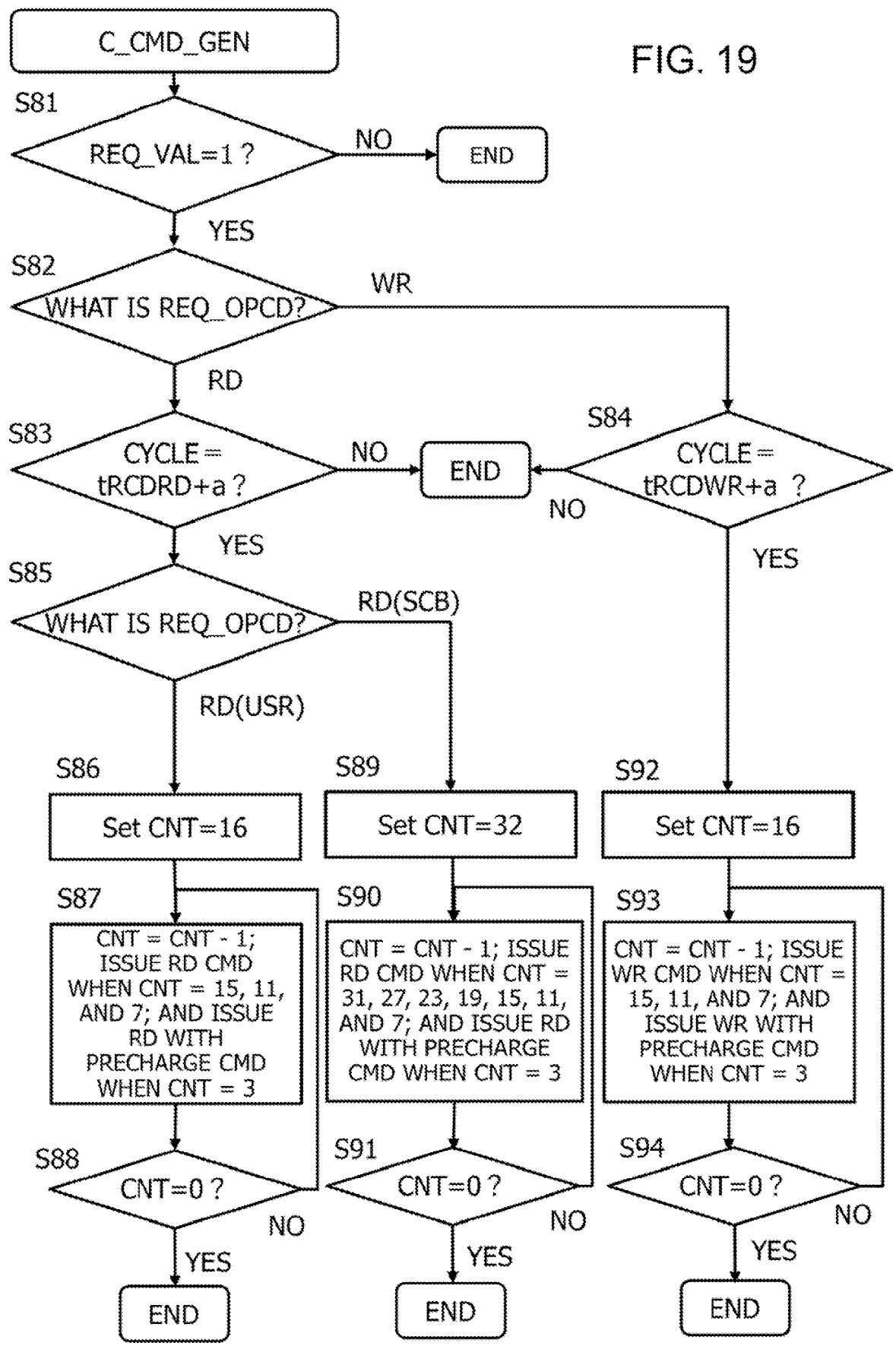
FIG. 19 illustrates a flowchart of an example of operation of the column command issuing unit.

FIG. 18 illustrates an example of the configuration of the column command issuing unit C_CMD_GEN. FIG. 19 illustrates a flowchart of an example of operation of the column command issuing unit. The column command issuing unit C_CMD_GEN is divided into an issuing unit EVEN on the even number side and an issuing unit ODD on the odd number side. The column command issuing units on the even number side and the odd number side each include an issuance determination circuit ISSUE_DET_e/o, a counter CNT_e/o, an information holding unit INF_HLD_e/o, and a column command issuing circuit C_CMD_GEN_CIR_e/o.

The request valid REQ_VAL, the request operation code REQ_OPCD, the cycle CYCLE, and the address ADRS are input to the issuance determination circuit ISSUE_DET_e/o as information on a request from the plurality of pipeline stages ST0 to STn of the request pipeline REQ_PIPE. Then, the issuance determination circuit determines a column command for a request from which of the pipeline stages is to be issued based on such information. This determination corresponds to the select process by the select circuit SELECT_2 in the request pipeline REQ_PIPE illustrated in FIG. 6. The specific determination process will be described with reference to FIG. 19.

The counter CNT_e/o has an initial value set in correspondence with the number of column commands to be issued, and counts down in synchronization with the clock CLK. The count value is used to control the timing to issue column commands to be issued sequentially. The counter includes a number of counters, the number being the same as the number of requests for which column commands are to be issued, and includes n+1 counters, n+1 being the same as the number of the pipeline stages ST0 to STn, for instance. This process will also be described with reference to FIG. 19.

The information holding unit INF_HLD_e/o holds information from each of the pipeline stages and is referenced by the issuance determination circuit and the column command issuing circuit.

Operation of the column command issuing unit will be described with reference to FIG. 19. The following operation is performed through cooperation of the issuance determination circuit ISSUE_DET_e/o, the counter CNT_e/o, and the column command issuing circuit C_CMD_GEN_CIR_e/o. First, when the request valid REQ_VAL=1 is met (YES in S81) for information in each of the pipeline stages ST0 to STn, the column command issuing unit C_CMD_GEN determines whether the request operation code REQ_OPCD is read RD or write WR (S82).

For read RD, when the cycle CYCLE reaches the command issuance constraint tRCDRD+a (alpha) (YES in S83), the column command issuing unit determines whether the request operation code REQ_OPCD is read RD(USR) for a user request or read RD(SCB) for a scrubbing request (S85).

When the request operation code REQ_OPCD is read RD(USR) for a user request (RD(USR) in S85), the column command issuing unit sets the counter CNT for the request to CNT=16 (S86). The process so far is executed by the issuance determination circuit ISSUE_DET_e/o.

After that, the column command issuing circuit C_CMD_GEN_e/o decrements the counter value CNT (CNT=CNT−1) in synchronization with the clock CLK, issues a read command RD_CMD when the counter value CNT is 15, 11, and 7, and issues a read command with precharge "RD WITH PRECHARGE_CMD" when the counter value CNT is 3 (S87). The process in S87 is repeatedly performed until the counter value CNT=0 is met (S88). It is understood that a read command for a user request is issued four times.

When the request operation code REQ_OPCD is read RD(SCR) for a scrubbing request (RD(SCB) in S85), the column command issuing unit sets the counter CNT for the request to CNT=32 (S89). The process so far is executed by the issuance determination circuit ISSUE_DET_e/o.

After that, the column command issuing circuit C_CMD_GEN_e/o decrements the counter value CNT (CNT=CNT−1) in synchronization with the clock CLK, issues a read command RD_CMD when the counter value CNT is 31, 27, 23, 19, 15, 11, and 7, and issues a read command with precharge "RD WITH PRECHARGE_CMD" when the counter value CNT is 3 (S90). The process in S90 is repeatedly performed until the counter value CNT=0 is met (S91). It is understood that a read command for a scrubbing request is issued eight times. The number of times, 8, is greater than the number of times, 4, of the issuance of a read command for a user request. When a read command with precharge is issued, the memory outputs data for read from the data terminal DQ, executes precharge to finish driving the word lines, and finishes operation for the user request.

When the determination in S82 is write WR, on the other hand, when the cycle CYCLE which indicates the number of clocks CLK after the issuance of active ACT which is a row command reaches the command issuance constraint tRCDWR+α (alpha) (YES in S84), the column command issuing unit sets the counter CNT for the request to CNT=16 (S92). The process so far is executed by the issuance determination circuit ISSUE_DET_e/o.

After that, the column command issuing circuit C_CMD_GEN_e/o decrements the counter value CNT (CNT=CNT−1) in synchronization with the clock CLK, issues a write command WR_CMD when the counter value CNT is 15, 11, and 7, and issues a write command with precharge "WR WITH PRECHARGE_CMD" when the counter value CNT is 3 (S93). The process in S93 is repeatedly performed until the counter value CNT=0 is met (S94). A write command is issued four times for a user request for write.

As has been described above, in the first embodiment, the MAC issues active to the row command bus and thereafter sequentially issues M reads to the memory via the column command bus for memory access for a user request. Meanwhile, the MAC issues active and thereafter issues N reads to the memory via the column command bus, N being greater than M, for memory access for a scrubbing request. Therefore, the MAC can issue a refresh command after active for a scrubbing request is issued and at the timing when active for a user request is not able to be issued. Consequently, it is possible to conceal a reduction in the performance to issue a user request, in which active for a user request is not able to be issued because of the issuance of refresh. That is, it is possible to suppress a reduction in the performance to issue a user request due to the issuance of refresh.

While the number M is determined as 4 and the number N is determined as 8 in the first embodiment, this is not limiting, and the number N may be an integer K times (K is an integer that is greater than 3) the number M. When the number N of times of issuance of read for a scrubbing request is too great, however, active and read for a user request are not able to be issued over a long time. Hence, the access length (number of reads) N for scrubbing is preferably the shortest length that allows refresh to be concealed. When N is 8, the issuance of a user request is inhibited by the latter four reads out of eight reads for scrubbing, and a reduction in the throughput of the issuance for a user request can be concealed even if refresh is issued. Alternatively, the number N may be set based on the time for which inhibition of the issuance for a user request can be permitted.

In the first embodiment, a scrubbing request is issued in synchronization with the timing to issue a refresh request. Normally, first intervals of issuance of a refresh request is shorter than second intervals of issuance of a scrubbing request. Thus, as described with reference to FIG. 9, the request issuing unit issues a scrubbing request each time the refresh request is issued K (four) times. However, the timing to issue a refresh request and the timing to issue a scrubbing request may not necessarily be synchronized with each other. Even if such timings are not synchronized, a reduction in the performance due to the issuance of active for a user request being inhibited by the issuance of refresh can be concealed to a certain degree if the possibility that the issuance for a refresh request coincides with or is close to the issuance for a scrubbing request is not zero.

Second Embodiment

In the first embodiment, the MAC performs memory access for a user request by issuing four reads for one active.

In a second embodiment, in contrast, the MAC performs memory access for a user request by executing one of (1) control for issuing four reads for one active and (2) control for issuing two reads for one active. For instance, for a user request with a short access length with only two reads, the MAC can save the issuance of two unnecessary reads.

In the second embodiment, when memory access for a user request is performed in the two ways described above, the MAC performs memory access for a scrubbing request by performing control for issuing four reads for one active. Consequently, it is possible to conceal a reduction in the performance of access control for a user request in (2), in which two reads are issued for one active, due to the issuance of a refresh command.

In the second embodiment, when memory access for a user request is performed in the two ways described above, the MAC may perform memory access for a scrubbing request by performing control for issuing eight reads for one active. In this case, it is possible to conceal a reduction in the performance of access control for a user request in (1) and (2) described above due to the issuance of a refresh command.

Figure 20:
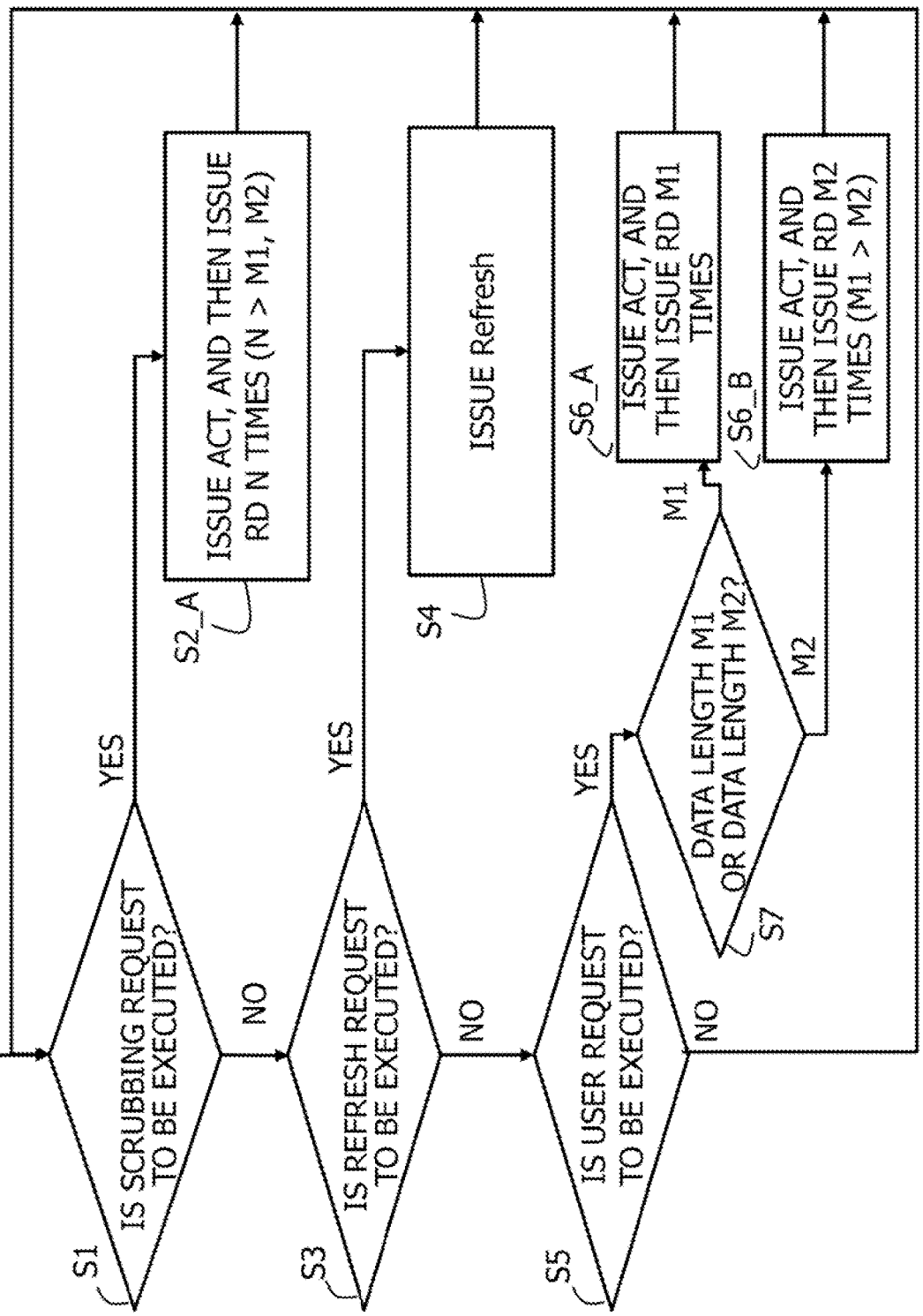
FIG. 20 illustrates a schematic flowchart of the memory access control by the MAC according to the second embodiment.

FIG. 20 illustrates a schematic flowchart of the memory access control by the MAC according to the second embodiment. When a scrubbing request is to be executed (YES in S1), the MAC issues active ACT to the row command bus, and thereafter issues read RD N times to the column command bus (S2_A). The number N may be four, for instance.

When a refresh request is to be executed (YES in S3), further, the MAC issues refresh Refresh to the row command bus (S4). Read etc. are not issued to the column command bus.

When a user request is to be executed (YES in S5), and when the access length for the user request is M1 (M1 in S7), the MAC issues active ACT to the row command bus, and thereafter issues read RD M1 times to the column command bus (S6_A). The number M1 may be four, for instance.

When a user request is to be executed (YES in S5), and when the access length for the user request is M2 (M1>M2)

(M2 in S7), on the other hand, the MAC issues active ACT to the row command bus, and thereafter issues read RD M2 times to the column command bus (S6_6). The number M2 may be two, for instance. This is different from FIG. 5.

That is, in the present embodiment, the hardware circuit of the MAC makes the access length (number of times of read) N for a scrubbing request greater than the access length (number of times of read) M2 for the shorter user request (N>M2). That is, the command issuing unit of the MAC makes the number of times N of the issuance of a read command for a scrubbing request greater than the number of times M2 of the issuance of a read command for a user request with the shorter access length.

In a modification of the second embodiment, N>M1>M2 may be met. In this case, the number N may be 8, for instance, and the numbers M1 and M2 may be 4 and 2, respectively, for instance. In this case, it is possible to conceal both a reduction in the performance for a user request with M1 reads and a reduction in the performance for a user request with M2 reads due to refresh.

EXAMPLE

Next, an example of the first embodiment will be described. First, in memory access for a user request by the MAC, one request includes one active which is a row command and four reads or writes which are column commands. In this case, if one column command allows reading or writing of data of 16 bytes, one user request allows access to data of 64 bytes.

In addition, a closed page memory access method in which a user request is completed with one active is used. The memory has 32 banks (BG [1:0], BA [2:0]).

The frequency of refresh is assumed as once in 0.062 μsec (62 nsec). In order to prevent bit inversion of stored data due to leakage of charge from the memory cells, it is needed to complete refresh of all the regions of the memory within a refresh completion time tREFI. It is assumed that tREFI=2 μsec is met, and a single bank refresh interface in which a refresh with 1 bank being refreshed is issued is used. That is, a refresh command is issued 32 times or more within tREFI=2 μsec. In this case, 0.0625 μsec is obtained by dividing tREFI=2 μsec by 32 which is the number of refresh commands, and it is only needed that refresh be performed once in 0.062 μsec (62 nsec).

In memory access for a scrubbing request, eight reads which are column commands are issued for one active. In this case, memory access for one scrubbing request allows execution of error check and correction for 128 bytes, i.e. 16 bytes*8 reads. Memory access for a scrubbing request is executed once per ten refreshes. The reason is as follows.

An ECC (error check and correction) circuit of a normal memory can recover an one bit error of data subjected to ECC. It is assumed that one cycle of scrubbing is executed every one hour for a memory having a memory capacity of 512 gigabytes. 0.84 μsec is obtained as the interval of the issuance of scrubbing by dividing the time for one day (24 h×60 min×60 sec) by 24 cycles of scrubbing for one day and the number of times of scrubbing for the entire memory (the total memory capacity 512 gigabytes divided by 128 bytes).

Thus, the frequency of refresh is once in 0.062 μsec, and the frequency of scrubbing is once in 0.84 μsec. Thus, it is only needed that scrubbing be executed once for ten refreshes. In this case, active for a user request is not able to be issued once in ten refreshes, and thus the degradation in the performance due to refresh is decreased to 90%.

According to the first aspect, a reduction in the throughput of memory access for a user request is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of is the invention.

What is claimed is:

1. A memory access controller comprising:
  a request issuing circuit configured to issue a user request in response to a memory request being input, issue a refresh request at first issuing intervals, and issue a scrubbing request at second issuing intervals; and
  a command issuing circuit configured to
  issue a first active command to a memory via a row command bus and issue M read commands to the memory via a column command bus after the first active command is issued, when memory access for the user request is to be executed,
  issue a refresh command to the memory via the row command bus when the memory access for the refresh request is executed,
  issue a second active command to the memory via the row command bus and issue N read commands to the memory via the column command bus after the second active command is issued, when the memory access for the scrubbing request is to be executed, the N being greater than the M, and
  issue the refresh command at a time when the first active command for the user request is not able to be issued after the second active command for the scrubbing request is issued.

2. The memory access controller according to claim 1, wherein the N is an integer times the M.

3. The memory access controller according to claim 2, wherein
  the second issuing interval is K times the first issuing interval, the K being a positive integer;
  the request issuing circuit configured to issue the refresh request at the first issuing intervals, and issue the scrubbing request each time the refresh request is issued K times; and
  the command issuing circuit configured to issue the second active command for the scrubbing request and the refresh command in response to the scrubbing request and the refresh request respectively.

4. The memory access controller according to claim 2, further comprising:
  a request selecting circuit provided between the request issuing circuit and the command issuing circuit, wherein
  the request selecting circuit includes
  a user request busy check circuit configured to check whether the user request issued by the request issuing circuit meets a command issuance constraint and a data terminal conflict constraint for the memory;
  a refresh request busy check circuit configured to check whether the refresh request issued by the request issuing circuit meets the command issuance constraint;

a scrubbing request busy check circuit configured to check whether the scrubbing request issued by the request issuing circuit meets the command issuance constraint and the data terminal conflict constraint; and a request selector circuit configured to select as a target to be executed the scrubbing request with a first priority and send notification of the scrubbing request to the command issuing circuit when all the scrubbing request, the user request, and the refresh request meet the command issuance constraint and the data terminal conflict constraint which is needed.

5. A method of memory access control comprising:

a request issuing process to issue a user request in response to a memory request being input, issue a refresh request at first issuing intervals, and issue a scrubbing request at second issuing intervals; and a command issuing process to issue a first active command to a memory via a row command bus and issue M read commands to the memory via a column command bus after the first active command is issued, when memory access for the user request is to be executed, issue refresh command to the memory via the row command bus when the memory access for the refresh request is executed, issue a second active command to the memory via the row command bus and issue N read commands to the memory via the column command bus after the second active command is issued, when the memory access for the scrubbing request is to be executed, the N being greater than the M, and issue the refresh command at a timing when the first active command for the user request is not able to be issued after the second active command for the scrubbing request is issued.

* * * * *